United States Patent [19]

Kodama

[11] Patent Number: 6,060,213
[45] Date of Patent: May 9, 2000

[54] POSITIVE-WORKING PHOTOSENSITIVE COMPOSITION

[75] Inventor: Kunihiko Kodama, Shizuoka, Japan

[73] Assignee: Fuji Photo Film Co., Ltd., Kanagawa, Rep. of Korea

[21] Appl. No.: 09/270,516

[22] Filed: Mar. 17, 1999

[30] Foreign Application Priority Data

Mar. 17, 1998 [JP] Japan .................. 10-066990

[51] Int. Cl.⁷ .................. G03C 1/73; G03C 1/72
[52] U.S. Cl. .................. 430/270.1; 430/905; 430/914; 430/921; 430/925
[58] Field of Search .................. 430/270.1, 905, 430/914, 921, 925, 326

[56] References Cited

FOREIGN PATENT DOCUMENTS

0708368 A1   4/1996   European Pat. Off. .
4124426A1    1/1992   Germany .
WO 96/17026  6/1996   WIPO .

OTHER PUBLICATIONS

Umehara et al. 116 : 245290, File HCA of STN Database Service, Chemical Abstracts, American Chemical Society, 1992. pp. 19–21 (English Abstract of DE 4124426).

Primary Examiner—Janet Baxter
Assistant Examiner—Sin J. Lee
Attorney, Agent, or Firm—Sughrue, Mion, Zinn, Macpeak & Seas, PLLC

[57] ABSTRACT

The present invention provides a positive-working photosensitive composition which comprises (a) a basic nitrogen-containing compound having a polycyclic structure represented by formula (I) and (b) at least one of compounds represented by formulae (II) to (IV) defined in the specification:

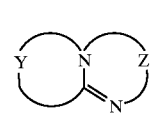

(I)

wherein Y and Z may be the same or different and each represent a straight-chain, branched or cyclic alkylene group, which may contain a hetero atom or may be substituted. The positive-working photosensitive composition which exhibits no reduction of width of resist pattern or no T-top deformation of surface shape of resist pattern with time between after exposure and heat treatment without causing sensitivity drop.

7 Claims, No Drawings

POSITIVE-WORKING PHOTOSENSITIVE COMPOSITION

FIELD OF THE INVENTION

The present invention relates to a positive-working photosensitive composition for use in the process for the production of lithographic printing plates and semiconductors such as IC or circuit boards for liquid crystal, thermal head, etc. or other photofabrication processes.

BACKGROUND OF THE INVENTION

There are various kinds of photosensitive compositions for use in the process for the production of lithographic printing plates, semiconductors such as IC, circuit boards for liquid crystal, thermal head, etc., or other photofabrication processes. For these purposes, photoresist photosensitive compositions are generally used. These photoresist photosensitive compositions are roughly divided into two types, i.e., positive-working and negative-working photoresist photosensitive compositions.

One of these positive-working photoresist photosensitive compositions is a chemically-sensitized resist composition as described in U.S. Pat. No. 4,491,628 and European Patent 249,139. The chemically-sensitized positive-working resist composition is a pattern-forming material which, when irradiated with radiation such as far ultraviolet rays, allows the exposed area to generate an acid in the presence of which it then undergoes reaction to change the solubility of the area irradiated with actinic radiation and the other area in a developer so that a pattern is formed on a substrate.

Examples of these pattern-forming materials include a combination of a compound which undergoes photodecomposition to generate an acid with acetal or 0, N-acetal compound (JP-A-48-89003 (The term "JP-A" as used herein means an "unexamined published Japanese patent application")), a combination of a compound which undergoes photodecomposition to generate an acid with orthoester or amide acetal compound (JP-A-51-120714), a combination of a compound which undergoes photodecomposition to generate an acid with a polymer having acetal or ketal in its main chain (JP-A-53-133429), a combination of a compound which undergoes photodecomposition to generate an acid with an enol ether compound (JP-A-55-12995), a combination of a compound which undergoes photodecomposition to generate an acid with an N-acyliminocarbonate compound (JP-A-55-126236), a combination of a compound which undergoes photodecomposition to generate an acid with a polymer having an orthoester group in its main chain (JP-A-56-17345), a combination of a compound which undergoes photodecomposition to generate an acid with a tertiary alkyl ester compound (JP-A-60-3625), a combination of a compound which undergoes photodecomposition to generate an acid with a silyl ester compound (JP-A-60-10247), and a combination of a compound which undergoes photodecomposition to generate an acid with a silyl ether compound (JP-A-60-37549, JP-A-60-121446). These compounds each exhibit a quantum yield of more than 1 in principle and thus show a high photosensitivity.

As a system which normally stays stable with time but undergoes decomposition to become alkali-soluble when heated in the presence of an acid there may be used a combination of a compound which generates an acid when exposed to light described in JP-A-59-45439, JP-A-60-3625, JP-A-229242, JP-A-63-27829, JP-A-63-36240, JP-A-63-250642, Poly. Eng. Sci., vol. 23, p. 1012 (1983), ACS. Sym. vol. 242, p. 11 (1984), Semiconductor World November 1987, p. 91, Macromolecules, vol. 21. p. 1475 (1988), SPIE, vol. 920, p. 42 (1988), etc. with a tertiary or secondary carbon (e.g., t-butyl, 2-cyclohexenyl) ester or ester carbonate compound. Such a system, too, has a high sensitivity and shows little absorption in far ultraviolet range. Thus, this system can be a system suitable for the reduction of wavelength of light from light source enabling ultrafine working.

The foregoing positive-working chemically-sensitized resists are roughly divided into two types, i.e., ternary system composed of an alkali-soluble resin, a compound which generates an acid when exposed to radiation (photo-acid generator) and a compound containing an acid-decomposable group which inhibits dissolution of the alkali-soluble resin and a binary system composed of a resin containing a group which undergoes reaction with an acid to undergo decomposition and become alkali-soluble and a photo-acid generator.

The foregoing binary or ternary positive-working chemically-sensitized resist is exposed to light to generate an acid from the photo-acid generator. In the presence of the acid thus generated, the positive-working chemically-sensitized resist is then subjected to heat treatment and development to provide a resist pattern.

JP-A-63-149640 proposes that an amine compound be added to stabilize the sensitivity of a lithographic printing plate which has been exposed. However, this proposal is disadvantageous in that the amine compound thus added causes the acid generated upon exposure to be partly deactivated, lowering the sensitivity of the lithographic printing plate. Further, EP-A-0795786 proposes that a specific photo-acid generator be used and 4-dimethylaminopyridine be used as an amine to inhibit the change in line width. However, this proposal is disadvantageous in that if the conventional amine compounds are added in an amount great enough to exert an effect of inhibiting the change in line width, sensitivity change can occur. This proposal also leaves something to be desired in resolution.

SUMMARY OF THE INVENTION

It is therefore an object of the present invention to provide a positive-working photosensitive composition which exhibits no reduction of width of resist pattern or no T-top deformation of surface shape of resist pattern with time between after exposure and heat treatment without causing sensitivity drop.

The foregoing object of the present invention will become more apparent from the following detailed description and examples.

The foregoing object of the present invention is accomplished by the following compositions:

(1) A positive-working photosensitive composition comprising (a) a basic nitrogen-containing compound having a polycyclic structure represented by the following general formula (I), (b) at least one of compounds represented by the following general formulae (II) to (IV) which generates an acid when irradiated with actinic rays, and (c) a resin containing a group which undergoes decomposition to increase its solubility in an alkaline developer when acted on by an acid:

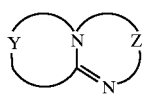
(I)

wherein Y and Z may be the same or different and each represent a straight-chain, branched or cyclic alkylene group which may contain a hetero atom or may be substituted;

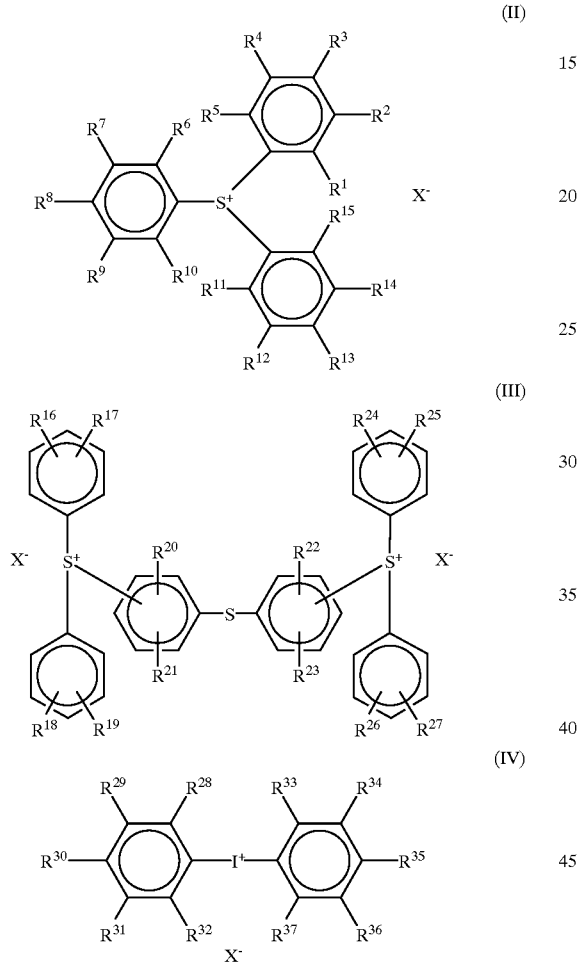

wherein $R^1$ to $R^{37}$ each represent a hydrogen atom, straight-chain, branched or cyclic alkyl group, straight-chain, branched or cyclic alkoxy group, hydroxyl group, halogen atom or —S—$R^{38}$ (in which $R^{38}$ represents a straight-chain, branched or cyclic alkyl or aryl group); and $X^-$ represents an anion of benzenesulfonic acid, naphthalenesulfonic acid or anthracenesulfonic acid having at least one group selected from the group consisting of branched or cyclic alkyl or alkoxy groups having 8 or more carbon atoms, at least two groups selected from the group consisting of straight-chain, branched or cyclic $C_{4-7}$ alkyl or alkoxy groups or at least three groups selected from the group consisting of straight-chain, branched or cyclic $C_{1-3}$ alkyl or alkoxy groups or an anion of benzenesulfonic acid, naphthalenesulfonic acid or anthracenesulfonic acid having at least one group selected from the group consisting of an ester group, $R^{39}$—CO— group, $R^{40}$—CONH— group, $R^{41}$—NH— group, $R^{42}$—OCONH— group, $R^{43}$—NHCOO— group, $R^{44}$—NHCONH— group, $R^{45}$—NHCSN— group, $R^{46}$—SO$_2$NH— group and nitro group (in which $R^{39}$ to $R^{46}$ each represent a straight-chain, branched or cyclic alkyl or aryl group).

(2) The positive-working photosensitive composition according to the above item (1), further comprising (d) a low molecular dissolution inhibitive compound with a molecular weight of not more than 3,000 containing a group capable of being decomposed by an acid which increases its solubility in an alkaline developer when acted on by an acid.

(3) A positive-working photosensitive composition comprising (a) a basic nitrogen-containing compound having a polycyclic structure represented by the general formula (I) defined in the above item (1), (b) at least one of compounds represented by the general formulae (II) to (IV) which generates an acid when irradiated with actinic rays, (d) a low molecular dissolution inhibitive compound with a molecular weight of not more than 3,000 containing a group capable of being decomposed by an acid which increases its solubility in an alkaline developer when acted on by an acid, and (e) a resin insoluble in water but soluble in an alkaline developer.

(4) The positive-working photosensitive composition according to the item (1) or (2), wherein the resin (c) which undergoes decomposition to increase its solubility in an alkaline developer when acted on by an acid is a resin containing a repeating structural unit represented by the following general formulae (V) and (VI):

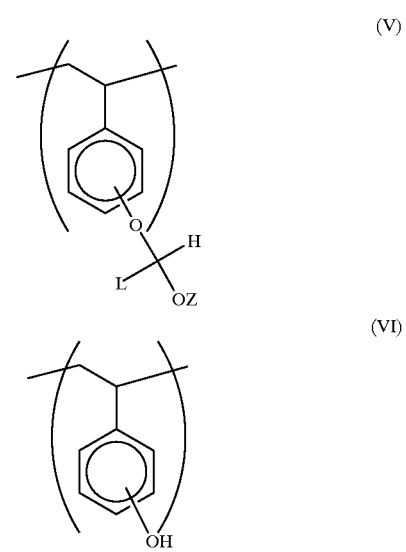

wherein L represents a hydrogen atom, a straight-chain, branched or cyclic alkyl group or an aralkyl group, which may be substituted; Z represents a straight-chain, branched or cyclic alkyl group or an aralkyl group, which may be substituted; and Z and L may be connected to each other to form a 5- or 6-membered ring.

The positive-working photosensitive composition according to the present invention comprises a compound represented by the foregoing general formula (I) incorporated therein as a basic nitrogen compound to give solution to the problem that even the improvement in the line width by the rise in the added amount causes sensitivity drop in chemically-sensitized resist, making it possible to obtain an excellent resist pattern.

DETAILED DESCRIPTION OF THE INVENTION

The components such as compound and resin to be incorporated in the positive-working photosensitive composition according to the present invention will be further described hereinafter.

[I] Basic Nitrogen-Containing Compound Having Polycyclic Structure (Component (a))

The basic nitrogen-containing compound having a polycyclic structure of the present invention is represented by the foregoing general formula (I) wherein Y and Z may be the same or different and each represent a straight-chain, branched or cyclic alkylene group which may contain a hetero atom or may be substituted.

Examples of the hetero atom include nitrogen atom, sulfur atom, and oxygen atom.

The alkylene group preferably has from 2 to 10 carbon atoms, more preferably from 2 to 5 carbon atoms.

Examples of substituents on the alkylene group include $C_{1-6}$ alkyl, aryl or alkenyl group, halogen atom, and halogen-substituted alkyl group.

Specific examples of the basic nitrogen-containing compound having a polycyclic structure of the present invention will be given below, but the present invention should not be construed as being limited thereto.

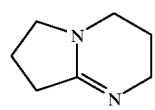
(I-1)

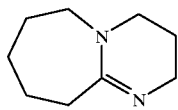
(I-2)

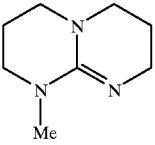
(I-3)

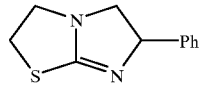
(I-4)

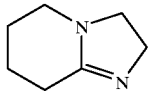
(I-5)

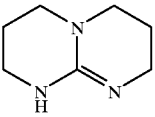
(I-6)

-continued

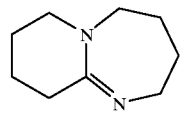
(I-7)

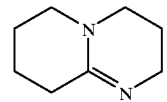
(I-8)

Particularly preferred examples of the compound represented by the general formula (I) are 1,8-diazabicyclo[5.4.0]undeca-7-ene and 1,5-diazabicyclo[4.3.0]nona-5-ene.

These basic nitrogen-containing compounds of the present invention may be used singly or in combination of two or more thereof. The amount of the basic nitrogen-containing compound to be used is normally from 0.001 to 10 parts by weight, preferably from 0.01 to 5 parts by weight based on 100 parts by weight of the photosensitive composition (excluding solvent). If the amount of the basic nitrogen-containing compound to be used falls below 0.001% by weight, the desired effect of the present invention cannot be exerted. On the contrary, if the amount of the basic nitrogen-containing compound to be used exceeds 10% by weight, it tends to lower the sensitivity of the positive-working photosensitive composition or deteriorate the developability of the exposed area.

[II] Compounds Represented by the General Formula (II) to (IV) which Generate an Acid when Irradiated with Actinic Rays (Component (b))

Examples of the straight-chain or branched alkyl group represented by $R^1$ to $R^{46}$ in the foregoing general formula (II) to (IV) include $C_{1-4}$ alkyl group which may contain substituents such as methyl, ethyl, propyl, n-butyl, sec-butyl and t-butyl. Examples of the cyclic alkyl group include $C_{3-8}$ alkyl group which may contain substituents such as cyclopropyl, cyclopentyl and cyclohexyl.

Examples of the alkoxy group represented by $R^1$ to $R^{37}$ include $C_{1-4}$ alkoxy group such as methoxy, ethoxy, hydroxyethoxy, propoxy, n-butoxy, isobutoxy, sec-butoxy andt-butoxy. Examples of the halogen atom represented by $R^1$ to $R^{37}$ include fluorine atom, chlorine atom, bromine atom, and iodine atom.

Examples of the aryl group represented by $R^{38}$ to $R^{46}$ include $C_{6-14}$ aryl group which may contain substituents such as phenyl, tolyl, methoxyphenyl and naphthyl.

Preferred examples of these substituents include $C_{1-4}$ alkoxy group, halogen atom (e.g., fluorine, chlorine, iodine), $C_{6-10}$ aryl group, $C_{2-6}$ alkenyl group, cyano group, hydroxyl group, carboxyl group, alkoxycarbonyl group, and nitro group.

The sulfonium or iodonium compound represented by the general formula (II), (III) or (IV) to be used herein contains as counter anion $X^-$ an anion of benzenesulfonic acid, naphthalenesulfonic acid or anthracenesulfonic acid having at least one branched or cyclic, alkyl or alkoxy group having 8 or more carbon atoms, preferably 10 or more carbon atoms, at least two straight-chain, branched or cyclic, $C_{4-7}$ alkyl or alkoxy groups or at least three straight-chain, branched or cyclic, $C_{1-3}$ alkyl or alkoxy groups or an anion of benzenesulfonic acid, naphthalenesulfonic acid or anthracenesulfonic acid having at least one group selected from the group consisting of an ester group, $R^{39}$—CO— group, $R^{40}$—CONH— group, $R^{41}$—NH— group, $R^{42}$—OCONH— group, $R^{43}$—NHCOO— group, $R^{44}$—NHCONH— group, $R^{45}$—NHCSN— group, $R^{46}$—SO$_2$NH— group and nitro group.

In this arrangement, the diffusibility of the acid generated after exposure (benzenesulfonic acid, naphthalenesulfonic acid or anthracenesulfonic acid containing the foregoing groups) can be reduced, and the solubility of the sulfonium or iodonium compound in solvents can be enhanced. In particular, from the standpoint of reduction in diffusibility, branched or cyclic alkyl or alkoxy groups are used preferably to straight-chain alkyl or alkoxy groups. When there is one such a group, the difference in diffusibility between straight-chain alkyl or alkoxy group and branched or cyclic alkyl or alkoxy group becomes more remarkable. From the standpoint of restraining the change in line width with the lapse of time from exposure to post heat treatment, most preferable is an anion of benzenesulfonic acid having at least one group selected from the group consisting of branched or cyclic alkyl or alkoxy groups having 8 or more carbon atoms, at least two groups selected from the group consisting of straight-chain, branched or cyclic $C_{4-7}$ alkyl or alkoxy groups, at least three groups selected from the group consisting of straight-chain, branched or cyclic $C_{1-3}$ alkyl or alkoxy groups, or an ester group.

Examples of the alkyl group having 8 or more carbon atoms, preferably from 8 to 20 carbon atoms, include branched or cyclic octyl, nonyl, decyl, undecyl, dodecyl, tridecyl, tetradecyl and octadecyl groups.

Examples of the alkoxy group having 8 or more carbon atoms, preferably from 8 to 20 carbon atoms, include branched or cyclic octyloxy, nonyloxy, decyloxy, undecyloxy, dodecyloxy, tridecyloxy, tetradecyloxy and octadecyloxy groups.

Examples of the $C_{4-7}$ alkyl group include straight-chain, branched or cyclic butyl, pentyl, hexyl and heptyl groups.

Examples of the $C_{4-7}$ alkoxy group include straight-chain, branched or cyclic butoxy, pentyloxy, hexyloxy and heptyloxy groups.

Examples of the $C_{1-3}$ alkyl group include methyl, ethyl, n-propyl and isopropyl groups.

Examples of the $C_{1-3}$ alkoxy group include methoxy, ethoxy, n-propoxy and isopropoxy groups.

The aromatic sulfonic acid represented by $X^-$ may contain as substituents halogen atoms (fluorine, chlorine, bromine, iodine), $C_{5-10}$ aryl, cyano, sulfide, hydroxyl, carboxyl or nitro group, etc. besides the foregoing specific substituents.

Specific examples of these compounds will be given below, but the present invention should not be construed as being limited thereto.

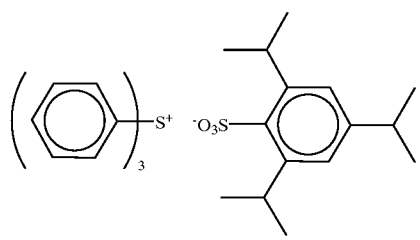

(II-1)

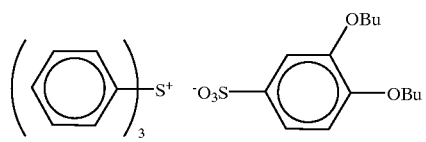

(II-2)

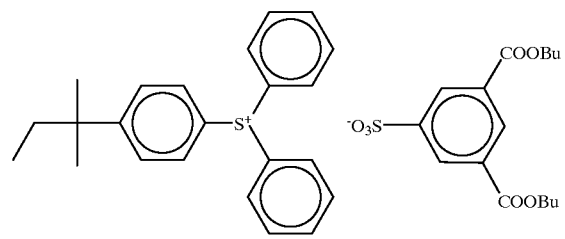

(II-3)

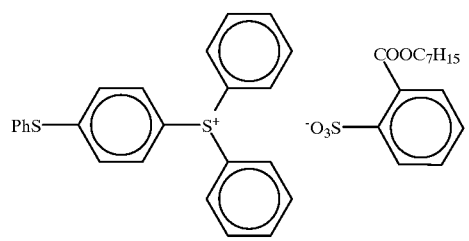

(II-4)

-continued
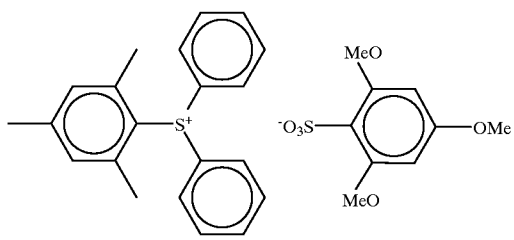 (II-5)
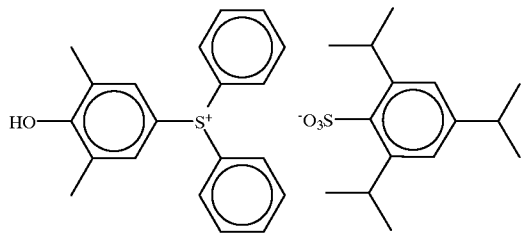 (II-6)
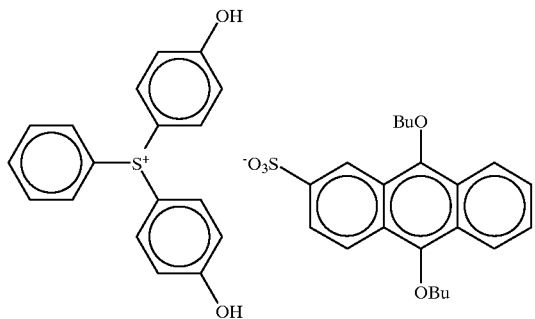 (II-7)
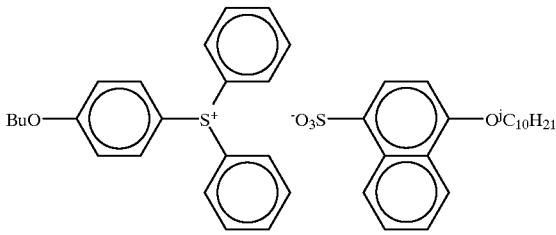 (II-8)
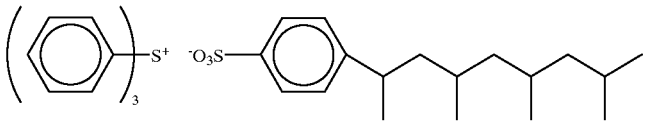 (II-9)
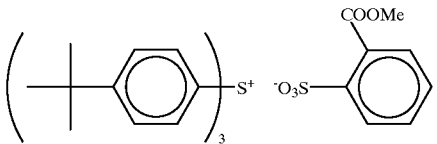 (II-10)

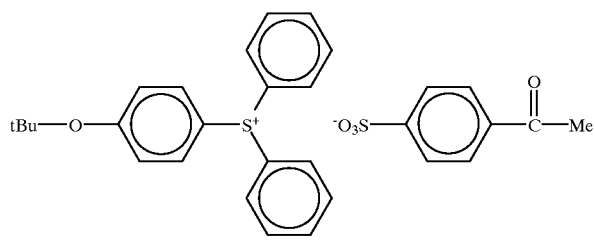
(II-11)
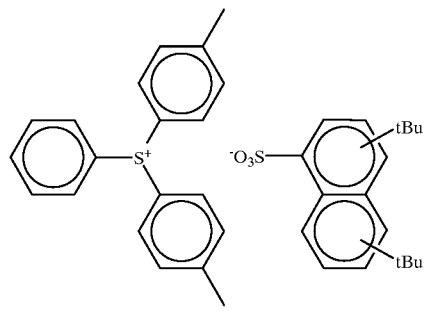
(II-12)
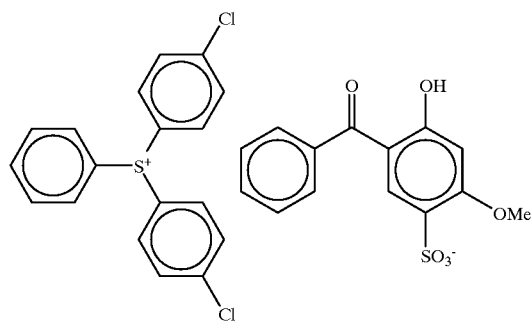
(II-13)
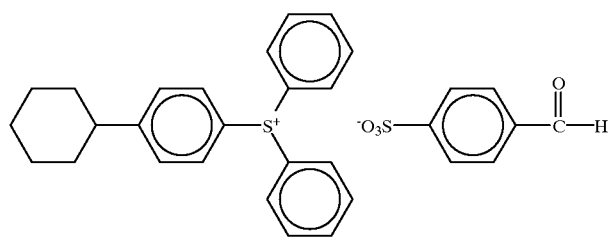
(II-14)
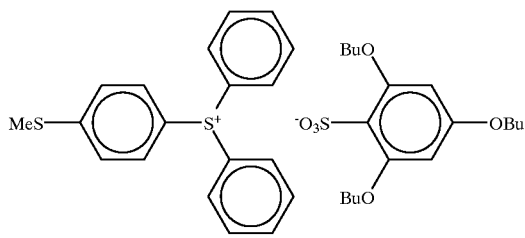
(II-15)

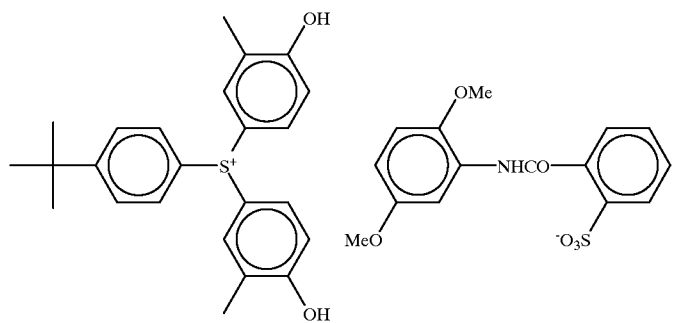
(II-16)
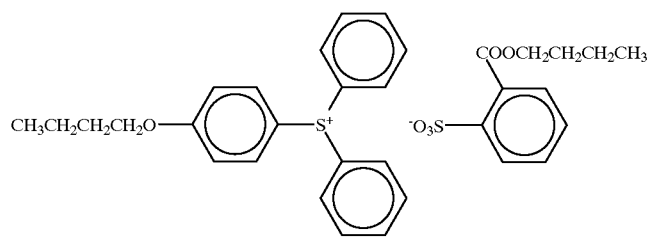
(II-17)
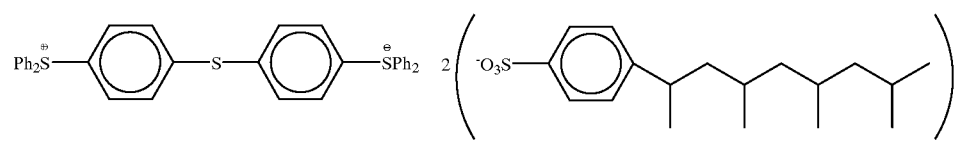
(III-1)
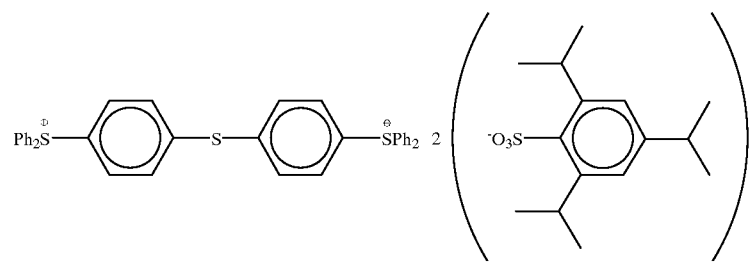
(III-2)
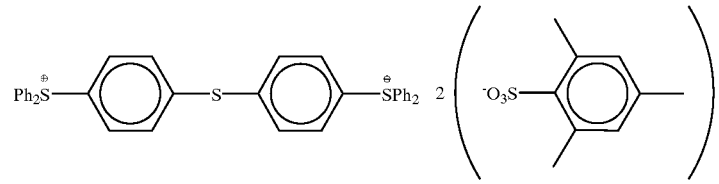
(III-3)
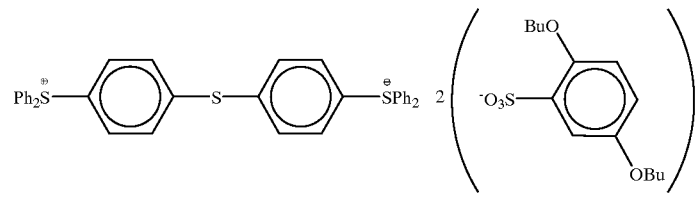
(III-4)

(III-5)
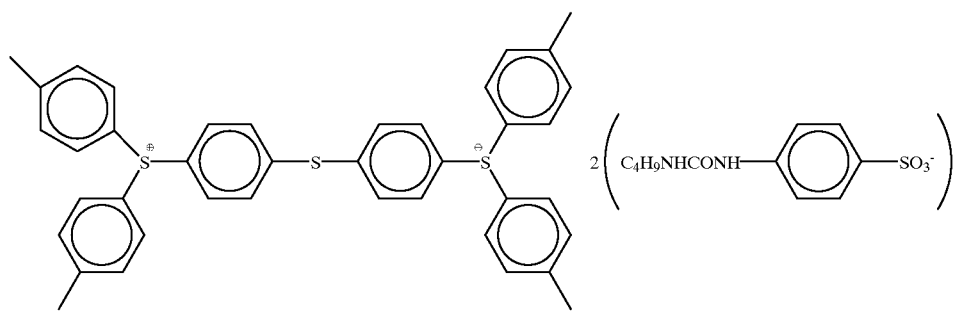
(III-6)
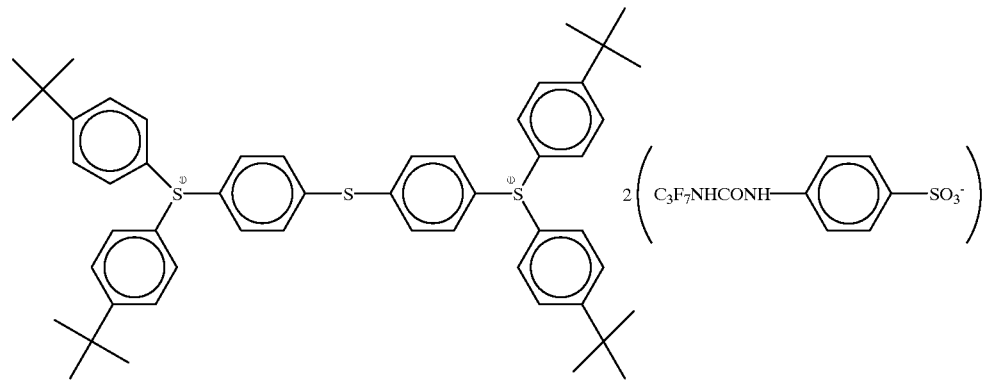
(III-7)
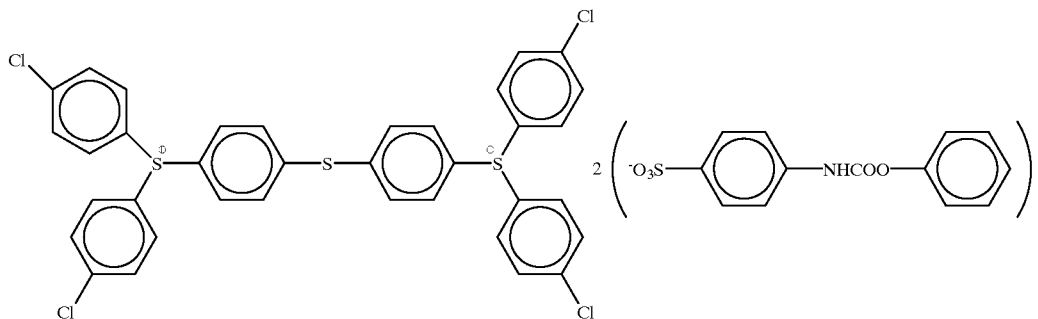
(IV-1)
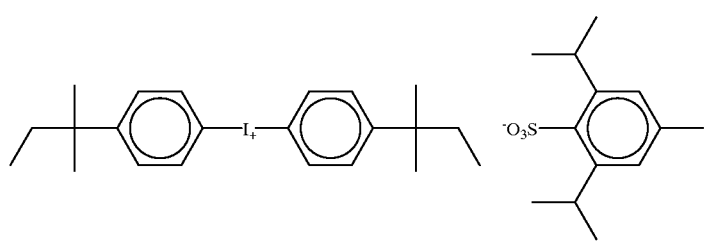
(IV-2)
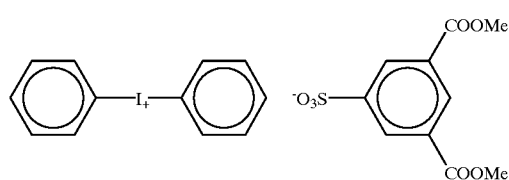
(IV-3)
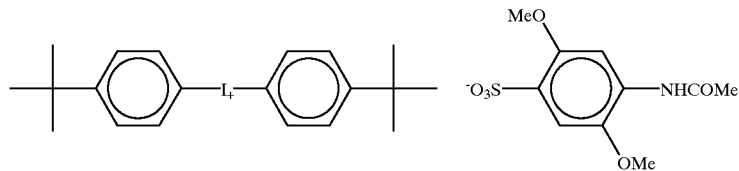

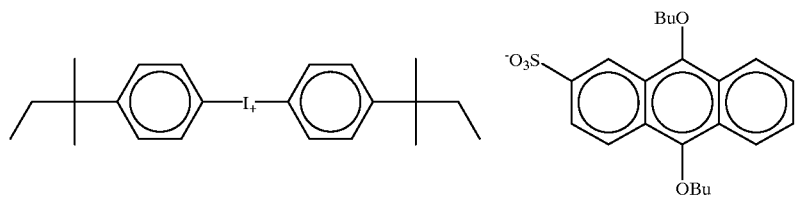
(IV-4)
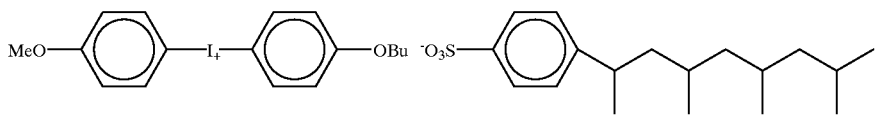
(IV-5)
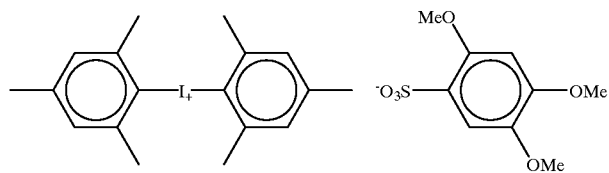
(IV-6)
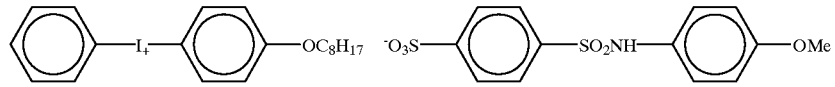
(IV-7)
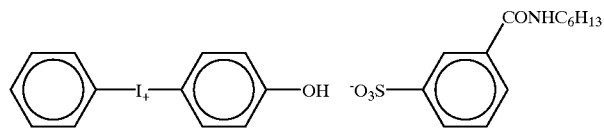
(IV-8)
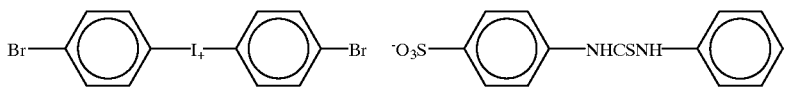
(IV-9)
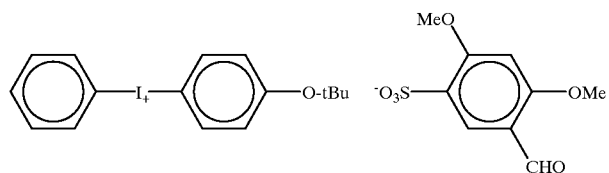
(IV-10)
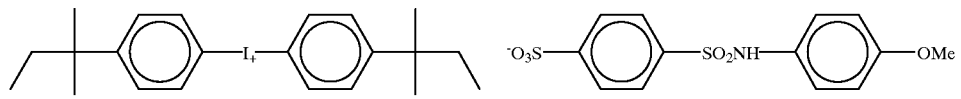
(IV-11)
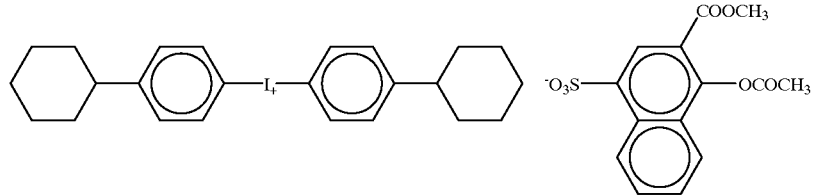
(IV-12)
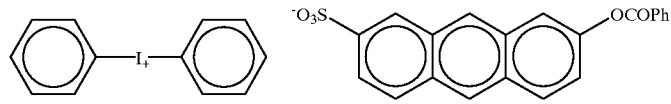
(IV-13)

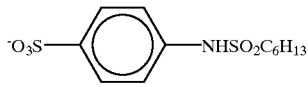

These compounds represented by the general formulae (II) to (IV) as components (b) may be used singly or in combination of two or more thereof.

The synthesis of the compound represented by the general formula (II), (III) or (IV) as the foregoing component (b) can be accomplished by the method described in U.S. Pat. No. 3,734,928, *Macromolecules*, vol. 10, 1307 (1977), *Journal of Organic Chemistry*, vol. 55, 4222 (1990), *J. Radiat. Curing*, vol. 5(1), 2(1978), etc., further involving the replacement of counter anion.

The total content of the compound represented by the general formula (II), (III) or (IV) as the foregoing component (b) in the photosensitive composition is preferably from 0.1 to 20% by weight, more preferably from 0.5 to 10% by weight, particularly from 1 to 7% by weight, based on the solid content of the photosensitive composition.

[III] Other Photo-acid Generators (b') Employable in Combination With Component (b)

The photosensitive composition of the present invention may comprise other compounds which undergo decomposition to generate an acid when irradiated with actinic rays or radiation (hereinafter referred to as "component (b')") besides the foregoing component (b) which generates an acid.

The content of the component (b') to be used in combination with the component (b) is preferably less than 70% by weight, more preferably less than 60% by weight, particularly less than 50% by weight based on the total weight of the photo-acid generators.

Examples of the photo-acid generator which can be used in combination with the component (b) include photocationic polymerization initiator, photoradical polymerization initiator, dye photodecolorizer, photodiscolorizer, compounds which generate an acid when irradiated with light to be incorporated in miroresists etc., and mixture thereof. These photo-acid generators may be properly selected.

Examples of these photo-acid generators include onium salts such as diazonium salts described in S. I. Schlesinger, Photogr. Sci. Eng., 18, 387 (1974), and T. S. Bal et al., Polymer, 21, 423 (1980), ammonium salts described in U.S. Pat. Nos. 4,069,055, 4,069,056, and Re 27,992, and Japanese Patent Application No. 3-140,140, phosphonium salts described in D. C. Necker et al., Macromolecules, 17, 2468 (1984), C. S. Wen et al., Teh, Proc. Conf. Rad. Curing ASIA, p. 478, Tokyo, October (1988), and U.S. Pat. Nos. 4,069,055 and 4,069,056, iodonium salts described in J. V. Crivello et al., Macromolecules, 10 (6), 1307 (1977), Chem. & Eng. News, November 28, p. 31 (1988), European Patent No. 104,143, U.S. Pat. Nos. 339,049 and 410,201, JP-A-2-150,858 and JP-A-2-296,514, sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European Patents 370,693, 3,902,114, 233,567, 297,443 and 297,442, U.S. Pat. Nos. 4,933,377, 161,811, 410,201, 339, 049, 4,760,013, 4,734,444 and 2,833,827, and German Patents 2,904,626, 3,604,580 and 3,604,581, selenonium salts described in J. V. Crivello et al., Macromolecule, 10 (6), 1307 (1977), J. V. Crivello et al., J. Polymer Sci., and Polymer Chem. Ed., 17, 1047 (1979) and arsonium salts described in C. S. Wen et al., Teh, Proc. Conf. Rad. Curing ASIA, p. 478, Tokyo, October (1988), organic halogen compounds described in U.S. Pat. No. 3,905,815, JP-A-46-4605, organic halogen compounds described in JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339, organic metal compounds and organic halides described inK. Meiter et al., J. Rad. Curing, 13 (4), 26 (1986), T. P. Gill et al., Inorg. Chem., 19, 3007 (1980), D. Astruc, Acc. Chem. Res., 19 (12), 377 (1896), and JP-A-2-16445, photo-acid generators containing o-nitrobenzyl type protective group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem Soc., 3571 (1965), P. M. Collins et al., J. Chem. Soc., Perkin I. 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patents 0290,750, 046,083, 156,535, 271,851 and 0,388, 343, U.S. Pat. Nos. 3,901,710 and 4,181,531, JP-A-60-198538, and JP-A-53-133022, compounds which undergo photodecomposition to generate sulfonic acid such as iminosulfonate described in M. TUNOOKA et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European Patents 0199,672, 84515, 199,672, 044,115 and 0101,122, U.S. Pat. Nos. 618,564, 4,371,605 and 4,431,774, JP-A-64-18143, JP-A-2-245756, and Japanese Patent Application No. 3-140109, and disulfone compounds described in JP-A-61-166544.

Alternatively, compounds having these photo-acid generators or compounds incorporated in main chain or side chains of polymer may be used such as those described in M. E. Woodhouse et al., J. Am. Chem. Soc., 104, 5586 (1982), S. P. Pappas et al., J. Imaging Sci., 30 (5), 218 (1986), S. Kondo et al., Makromol. Chem. Rapid Commun., 9, 625 (1988), Y. Yamada et al., Makromol. Chem., 152, 153, 163 (1972), J. V. Crivello et al., J. Polymer Sci., Polymer Chem. Ed., 17, 3845 (1979), U.S. Pat. No. 3,849,137, German Patent 3914407, JP-A-63-26653, JP-A-55-164824, JP-A-62-69263, JP-A-63-146038, JP-A-63-163452, JP-A-62-153853, and JP-A-63-146029.

Further, photo-acid generators described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778, and European Patent 126,712 may be used.

Among the foregoing other compounds which undergo decomposition to generate an acid when irradiated with actinic rays or radiation, those which can be particularly effectively used will be described hereinafter.

(1) Oxazole derivatives represented by the following general formula (PAG1) or S-triazine derivatives represented by the following general formula (PAG2) substituted by trihalomethyl group

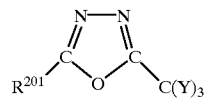
(PAG1)

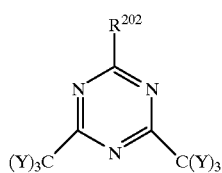
(PAG2)

wherein $R^{201}$ represents a substituted or unsubstituted aryl or alkenyl group; $R^{202}$ represents a substituted or unsubstituted aryl, alkenyl or alkyl group or —C(Y)$_3$; and Y represents a chlorine or bromine atom.

Specific examples of these compounds will be given below, but the present invention should not be construed as being limited thereto.

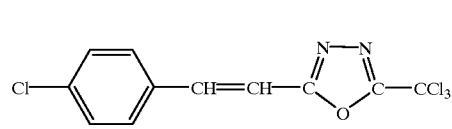
(PAG1-1)

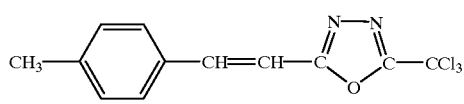
(PAG1-2)

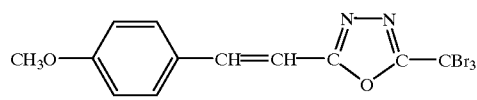
(PAG1-3)

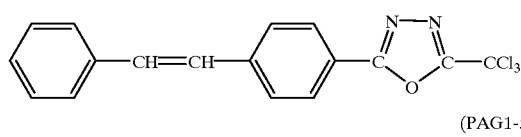
(PAG1-4)

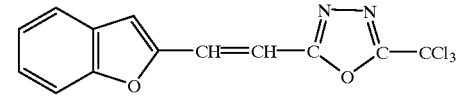
(PAG1-5)

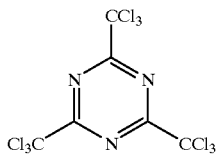
(PAG2-1)

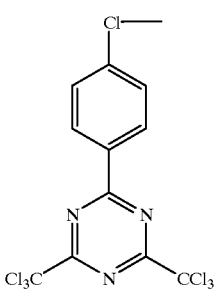
(PAG2-2)

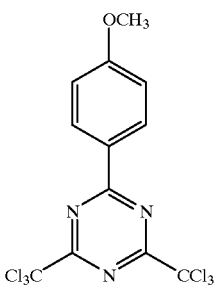
(PAG2-3)

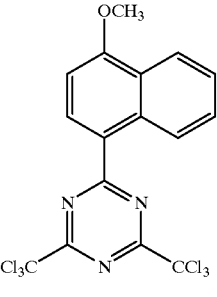
(PAG2-4)

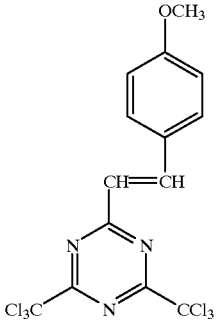
(PAG2-5)

(2) Iodonium salts represented by the following general formula (PAG3) or sulfonium salts represented by the general formula (PAG4):

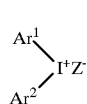
(PAG3)

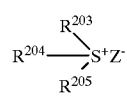
(PAG4)

In the foregoing general formulae, $Ar^1$ and $Ar^2$ each independently represent a substituted or unsubstituted aryl group. Preferred examples of substituents on the aryl group include alkyl group, haloalkyl group, cycloalkyl group, aryl group, alkoxy group, nitro group, carboxyl group, alkoxycarbonyl group, hydroxyl group, mercapto group, and halogen atom.

$R^{203}$, $R^{204}$ and $R^{205}$ each independently represent a substituted or unsubstituted alkyl or aryl group, preferably a $C_{6-14}$ aryl group, $C_{1-8}$ alkyl group or substituted derivative thereof. Preferred examples of substituents on these alkyl groups include $C_{1-8}$ alkoxy group, $C_{1-8}$ alkyl group, nitro group, carboxyl group, hydroxyl group, and halogen atom. Preferred examples of substituents on these alkyl groups include $C_{1-8}$ alkoxy, carboxyl and alkoxycarbonyl groups.

$Z^-$ represents a counter ion. Examples of the counter ion include $BF_4^-$, $PF_6^-$, $SbF_6^-$, $SiF_2^{2-}$, $ClO_4^-$, perfluoroalkanesulfonic acid anion such as $CF_3SO_3^-$, pentafluorobenzene sulfonic acid anion, condensed polynuclear aromatic sulfonic acid anion such as naphthalene-1-sulfonic acid anion, anthraquinonesulfonic acid anion, and sulfonic acid group-containing dye.

Two of $R^{203}$, $R^{204}$ and $R^{205}$ and $Ar^1$ and $Ar^2$ may be connected to each other via their single bond or substituent.

Specific examples of the compounds represented by the foregoing general formulae (PAG3) and (PAG4) will be given below, but the present invention should not be construed as being limited thereto.

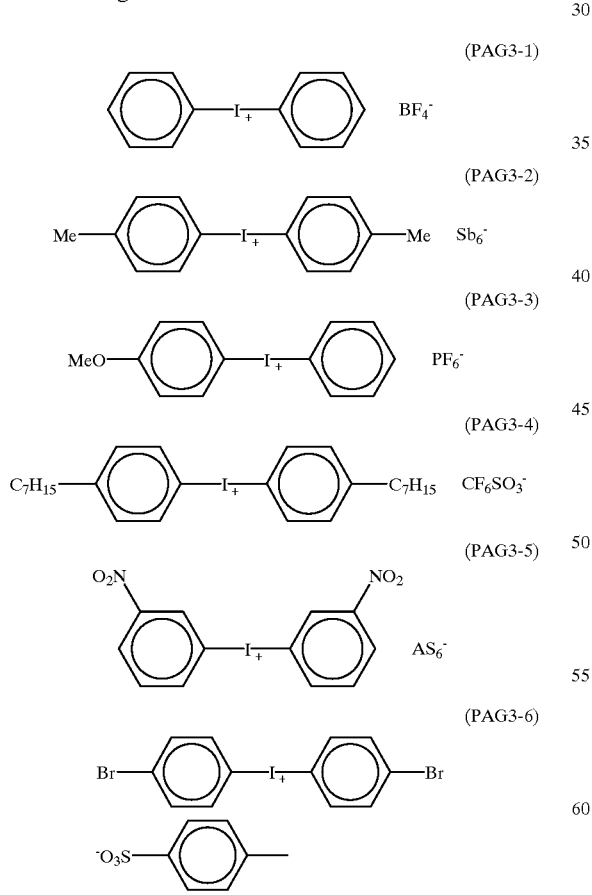

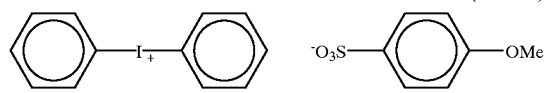

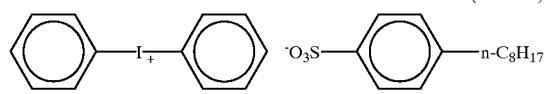

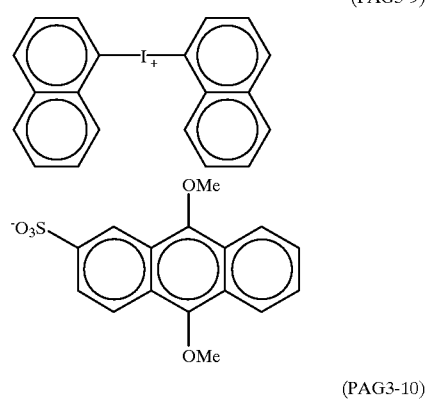

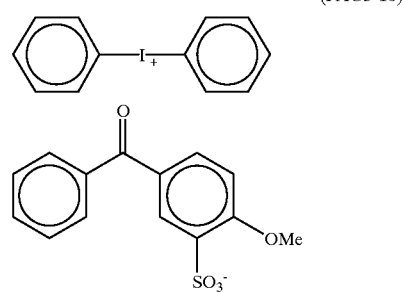

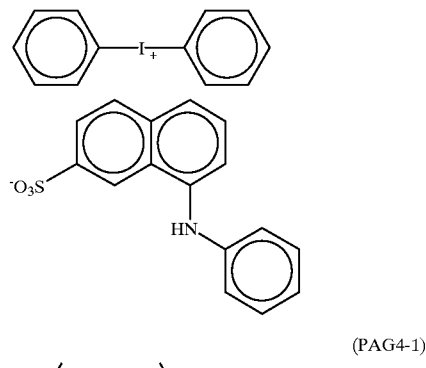

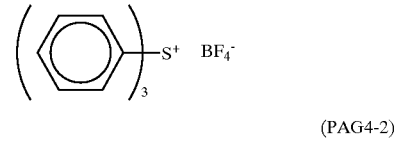

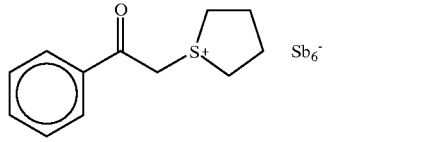

(PAG4-3)
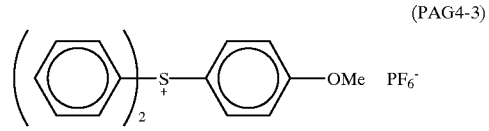

(PAG4-4)
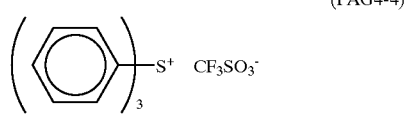

(PAG4-5)
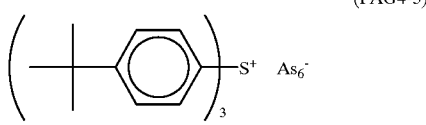

(PAG4-6)
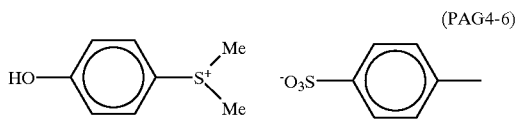

(PAG4-7)
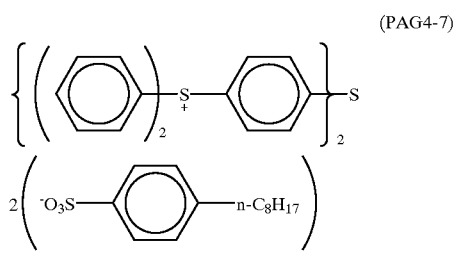

(PAG4-8)
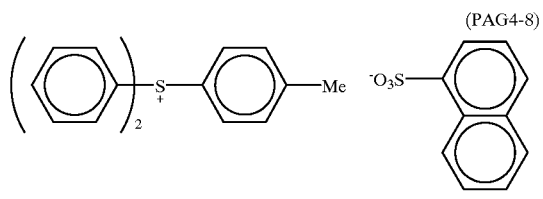

(PAG4-9)
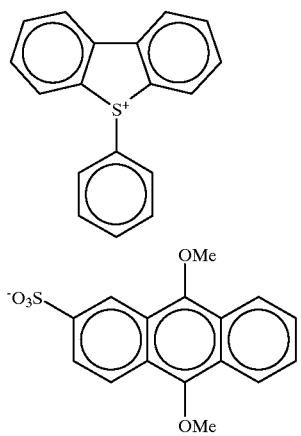

(PAG4-10)
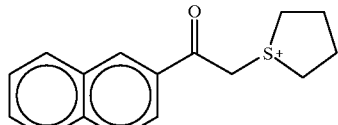

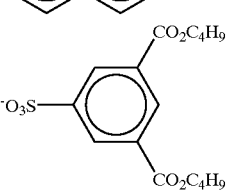

(PAG4-11)
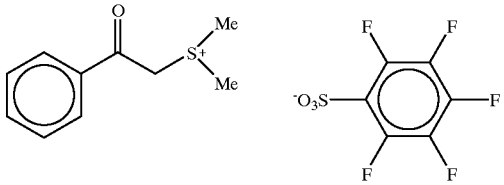

The onium salts represented by the general formulae (PAG3) and (PAG4) are known. The synthesis of these onium salts can be accomplished by the method described in J. W. Knapczyk et al., J. Am. Chem. Soc., 91, 145 (1969), A. L. Maycok et al., J. Org. Chem., 35, 2532, (1970), E. Goethas et al., Bull. Soc. Chem. Belg., 73, 546, (1964), H. M. Leicester, J. Ame. Chem. Soc., 51, 3587 (1929), J. V. Crivello et al., J. Polym. Chem. Ed., 18, 2677 (1980), U.S. Pat. Nos. 2,807,648 and 4,247,473, and JP-A-53-101,331.

(3) Disulfone derivatives represented by the following general formula (PAG5) or iminosulfonate derivatives represented by the following general formula (PAG6)

(PAG5)
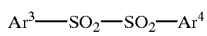

(PAG6)
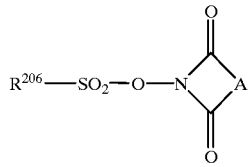

wherein $Ar^3$ and $Ar^4$ each independently represent a substituted or unsubstituted aryl group; $R^{206}$ represents a substituted or unsubstituted alkyl or aryl group; and A represents a substituted or unsubstituted alkylene, alkenylene or arylene group.

Specific examples of these compounds represented by the general formulae (PAG5) and (PAG6) will be given below, but the present invention should not be construed as being limited thereto.

(PAG5-1)
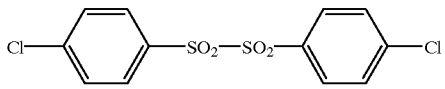

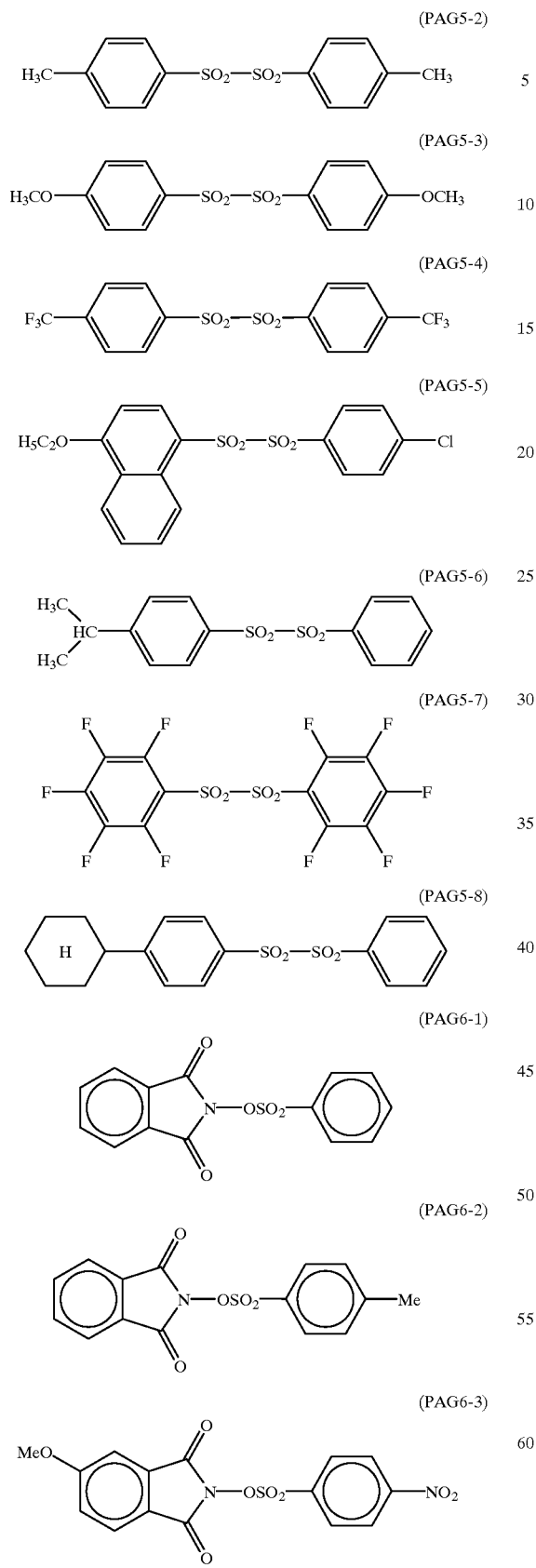
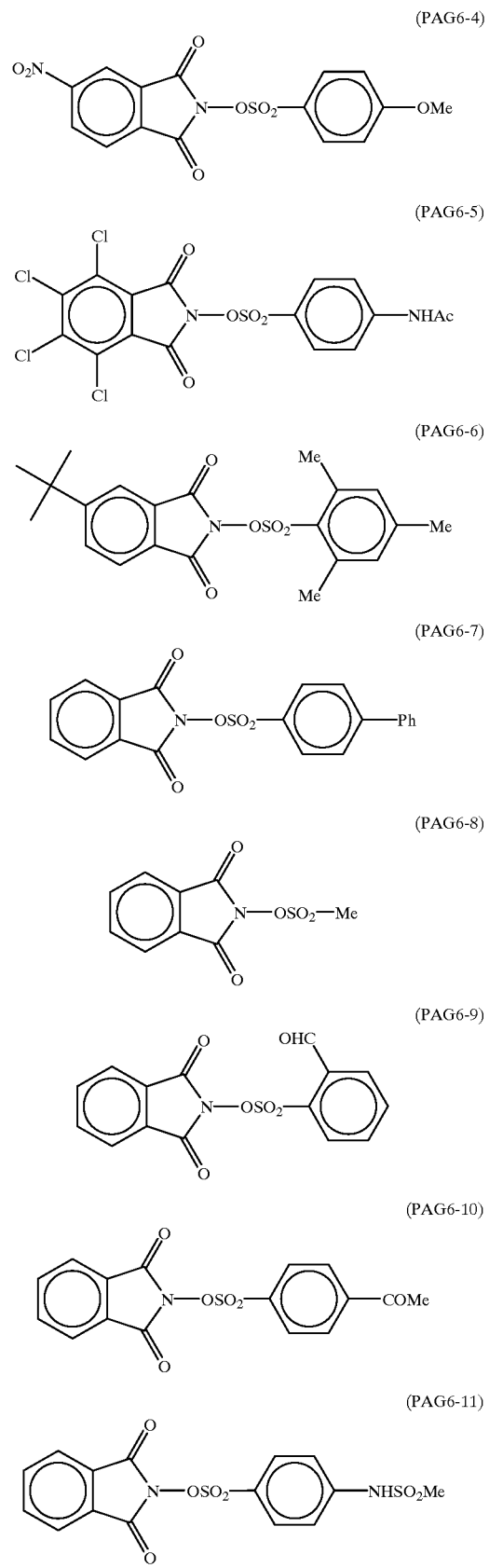

(PAG6-12) 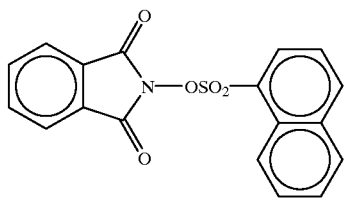

(PAG6-13) 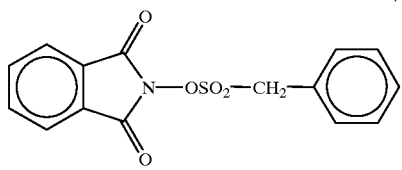

(PAG6-14) 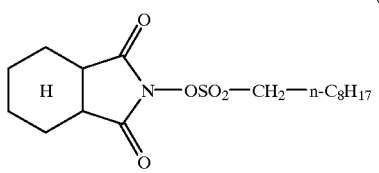

(PAG6-15) 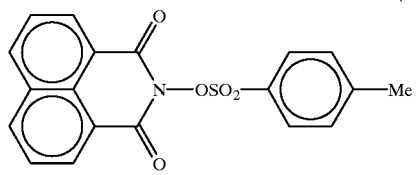

(PAG6-16) 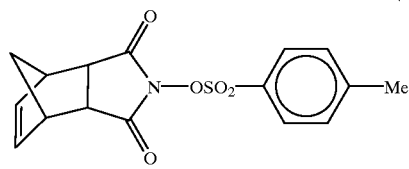

(PAG6-17) 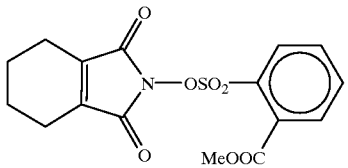

(PAG6-18) 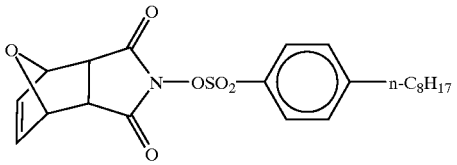

(PAG6-19) 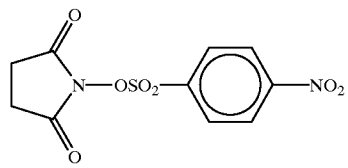

(PAG6-20) 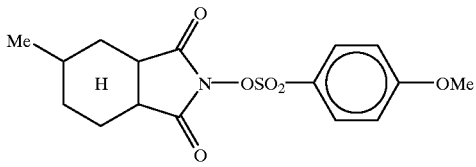

(PAG6-21) 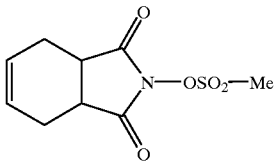

(PAG6-22) 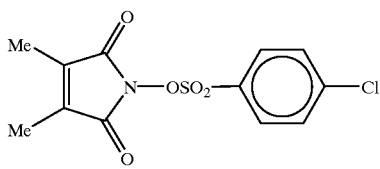

(PAG6-23) 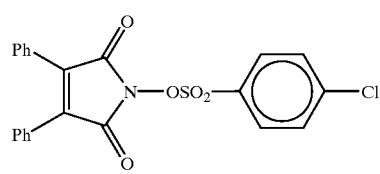

(PAG6-24) 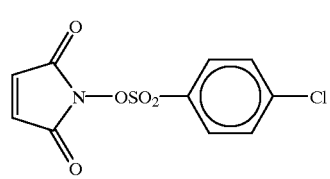

(PAG6-25) 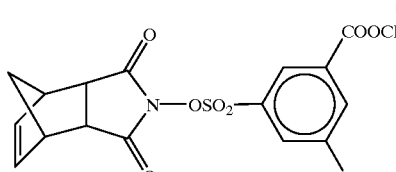

(PAG6-26) 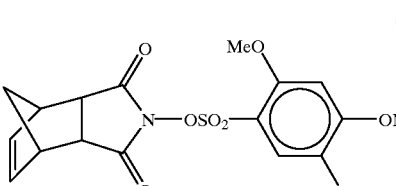

[IV] Resin Containing a Group which Undergoes Decomposition to Increase its Solubility in an Alkaline Developer when Acted on by an Acid (Hereinafter Referred to as "Component (c)")

As the resin to be used in chemically-sensitized resist of the present invention which undergoes decomposition to increase its solubility in an alkaline developer when acted on by an acid (also referred to as "acid-decomposable group") there may be used a resin containing an acid-decomposable group in either or both of main chain and side chains, preferably side chains.

Preferred examples of the acid-decomposable group include —COOA⁰ and —O—B⁰ groups. Examples of the group containing such an acid-decomposable group include groups represented by —R⁰—COOA⁰ and —Ar—O—B⁰.

A⁰ represents —C(R⁰¹)(R⁰²)(R⁰³), —Si(R⁰¹)(R⁰²)(R⁰³) or —C(R⁰⁴)(R⁰⁵)—O—R⁰⁶ group. B⁰ represents A⁰ or —CO—O—A⁰ group (in which R⁰, R⁰ to R⁰⁶, and Ar are as defined above).

Preferred examples of the acid-decomposable group include silylether group, cumylester group, acetal group, tetrahydropyranylether group, enol ether group, enol ester group, tertiary alkyl ether group, tertiary alkyl ester group, and tertiary alkylcarbonate group. Preferred among these acid-decomposable groups are tertiary alkyl ester group, tertiary alkylcarbonate group, cumylester group, acetal group, and tetrahydropyranylether group. Particularly preferred among these acid-decomposable groups is acetal group.

The parent resin to which the foregoing acid-decomposable group is bonded as a side chain is an alkali-soluble resin having —OH or —COOH group, preferably —R⁰—COOH or —Ar—OH group, in its side chains. For example, alkali-soluble resins described later may be used.

The rate at which such an alkali-soluble resin is dissolved in an alkali is preferably not less than 170 A/sec., particularly not less than 330 A/sec. as determined with 0.261 N tetramethyl ammonium hydroxide (TMAH) at 23° C.

In the light of accomplishment of rectangular profile, an alkali-soluble resin having a high transmittance with respect to far ultraviolet rays or exima laser beam is preferred. Preferably, the alkali-soluble resin exhibits a transmittance of from 20 to 90% at 248 nm when it is in the form of film having a thickness of 1 μm.

From this standpoint of view, particularly preferred examples of the alkali-soluble resin include o-, m-, p-poly (hydroxystyrene), copolymers thereof, hydrogenated poly (hydroxystyrene), halogen- or alkyl-substituted poly (hydroxystyrene), partially O-alkylated or O-acylated poly (hydroxystyrene), styrene-hydroxystyrene copolymer, α-methylstyrene-hydroxystyrene copolymer, and hydrogenated novolak resin.

The resin containing an acid-decomposable group to be used herein can be obtained by reacting an alkali-soluble resin with a precursor of acid-decomposable group or copolymerizing an alkali-soluble resin monomer to which an acid-decomposable group is connected with various monomers as disclosed in European Patent 254853, JP-A-2-25850, JP-A-3-223860, and JP-A-4-251259.

Specific examples of the resin having an acid-decomposable group to be used herein will be given below, but the present invention should not be construed as being limited thereto.

p-t-Butoxystyrene/p-hydroxystyrene copolymer, p-(t-butoxycarbonyloxy)styrene/p-hydroxystyrene copolymer, p-(t-butoxycarbonylmethyloxy)styrene/p-hydroxystyrene copolymer, 4-(t-butoxycarbonylmethyloxy) -3-methylstyrene/4-hydroxy-3-methylstyrene copolymer, p-(t-butoxycarbonylmethyloxy) styrene/p-hydroxystyrene (10% hydrogenated product) copolymer, m-(t-butoxycarbonylmethyloxy)styrene/m-hydroxystyrene copolymer, o-(t-butoxycarbonylmethyloxy) styrene/o-hydroxystyrene copolymer, p-(cumyloxycarbonylmethyloxy)styrene/p-hydroxystyrene copolymer, cumyl methacrylate/methyl methacrylate copolymer, 4-t-butoxycarbonylstyrene/dimethyl maleate copolymer, benzyl methacrylate/tetrahydropyranyl methacrylate, p-(t-butoxycarbonylmethyloxy)styrene/p-hydroxystyrene/styrene copolymer, p-t-butoxystyrene/p-hydroxystyrene/fumaronitrile copolymer, t-butoxystyrene/hydroxyethyl methacrylate copolymer, styrene/N-(4-hydroxyphenyl)maleimide/N-(4-t-butoxycarbonyloxyphenyl) maleimide copolymer, p-hydroxystyrene/t-butyl methacrylate copolymer, p-hydroxystyrene/t-butyl acrylate copolymer, p-(t-butoxycarbonylmethyloxy)styrene/p-hydroxystyrene/N-methylmaleiimide copolymer, t-butyl methacrylate/1-adamantyl methacrylate copolymer, p-hydroxystyrene/t-butyl acrylate/p-acetoxystyrene copolymer, p-hydroxystyrene/t-butyl acrylate/p-(t-butoxycarbonyloxy) styrene copolymer, p-hydroxystyrene/t-butyl acrylate/p-(t-butoxycarbonylmethyloxy) styrene copolymer, and

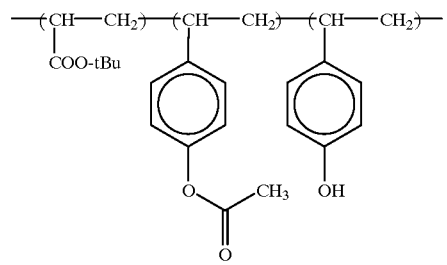

The content of the acid-decomposable group is represented by B/(B+S) wherein B represents the number of acid-decomposable groups in the resin and S represents the number of alkali-soluble groups which are not protected by the acid-decomposable group. B/(B+S) is preferably from 0.01 to 0.7, more preferably from 0.05 to 0.50, particularly from 0.10 to 0.50. If B/(B+S) exceeds 0.7, it disadvantageously causes film shrinkage after PEB, poor adhesion to substrate or generation of scum. On the contrary, if B/(B+S) falls below 0.01, it can disadvantageously cause standing wave to remain remarkably on the side wall of pattern.

As the resin containing an acid-decomposable group employable herein there is preferably used a resin having a repeating structural unit represented by the foregoing general formula (V) or (VI). This resin provides a positive-working photosensitive composition which gives a high resolution image and exhibits less change of properties with time between exposure and heating.

Examples of the alkyl group represented by L or Z in the general formula (V) include $C_{1-20}$ straight-chain, branched and cyclic alkyl groups such as methyl, ethyl, propyl, isopropyl, n-butyl, isobutyl, t-butyl, pentyl, cyclopentyl, hexyl, cyclohexyl, octyl and dodecyl. Preferred examples of substituents on these alkyl groups include alkoxyl group, hydroxyl group, halogen atom, nitro group, acyl group, acylamino group, and sulfonylamino group.

Examples of the aralkyl group represented by L or Z include $C_{7-15}$ aralkyl group such as substituted or unsubstituted benzyl group and substituted or unsubstituted phenethyl group. Preferred examples of substituents on these aralkyl groups include alkoxyl group, hydroxyl group, halogen atom, nitro group, acyl group, acylamino group, and sulfonylamino group.

Examples of the 5- or 6-membered ring formed by the connection of L and Z include tetrahydropyran ring and tetrahydrofurane ring.

The ratio of the repeating structural unit represented by the general formula (V) to the repeating structural unit represented by the general formula (VI) in the foregoing resin is preferably 1/99 to 60/40, more preferably 5/95 to 50/50, particularly from 10/90 to 40/60.

The foregoing resin containing repeating structural unitsrepresentedbythegeneralformulae (V) and (VI) may-comprise structural units derived from other monomers incorporated therein.

Examples of the other monomers include hydrogenated hydroxystyrene, alkoxy- or alkyl-substituted hydroxystyrene, styrene, halogen-, alkoxy-, acyloxy- or alkyl-substituted styrene, maleic anhydride, acrylic acid derivative, methacrylic acid derivative, and N-substituted maleimide, but the present invention should not be construed as being limited thereto.

The molar ratio of the structural units represented by the general formulae (V) and (VI) to the structural units derived from other monomers [(V)+(VI)]/[other monomer components] is from 100/0 to 50/50, preferably from 100/0 to 60/40, more preferably from 100/0 to 70/30.

Specific examples of the resin containing repeating structural units represented by the general formulae (V) and (VI) will be given below.

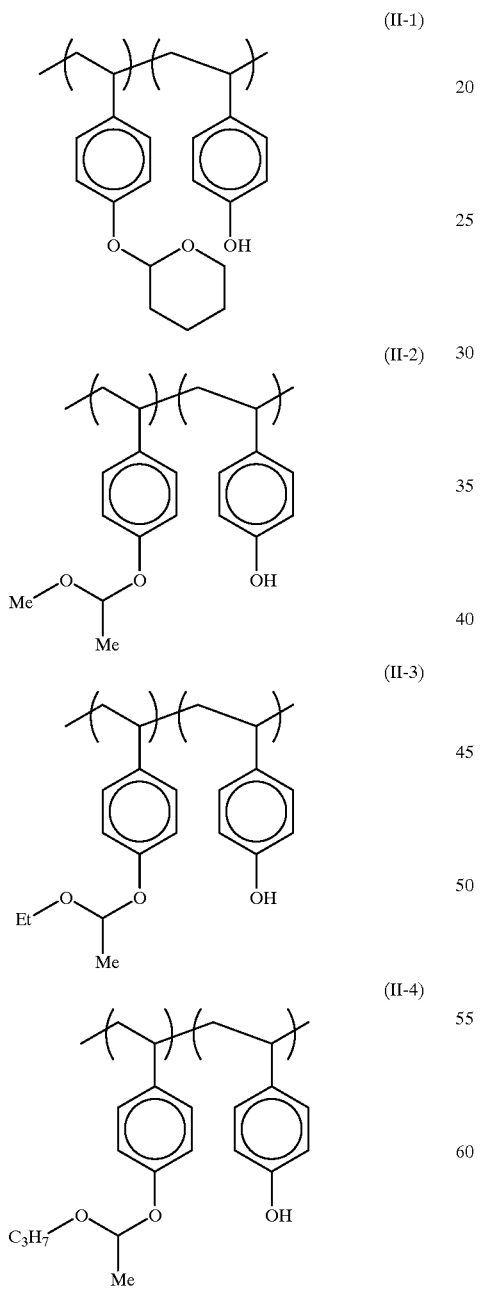
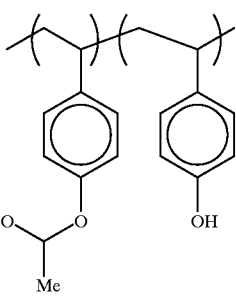
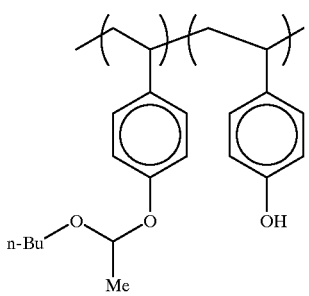
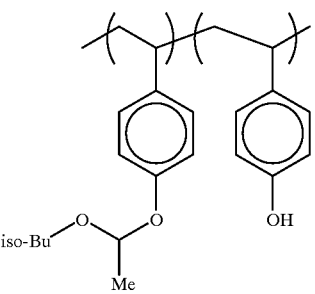
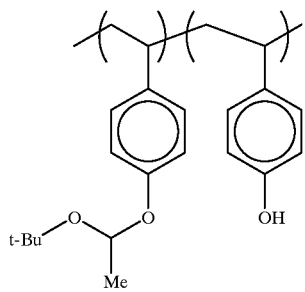
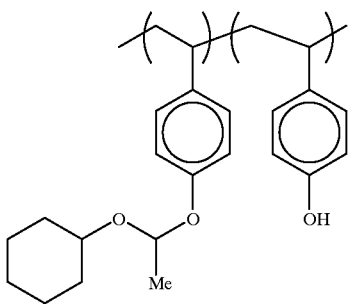

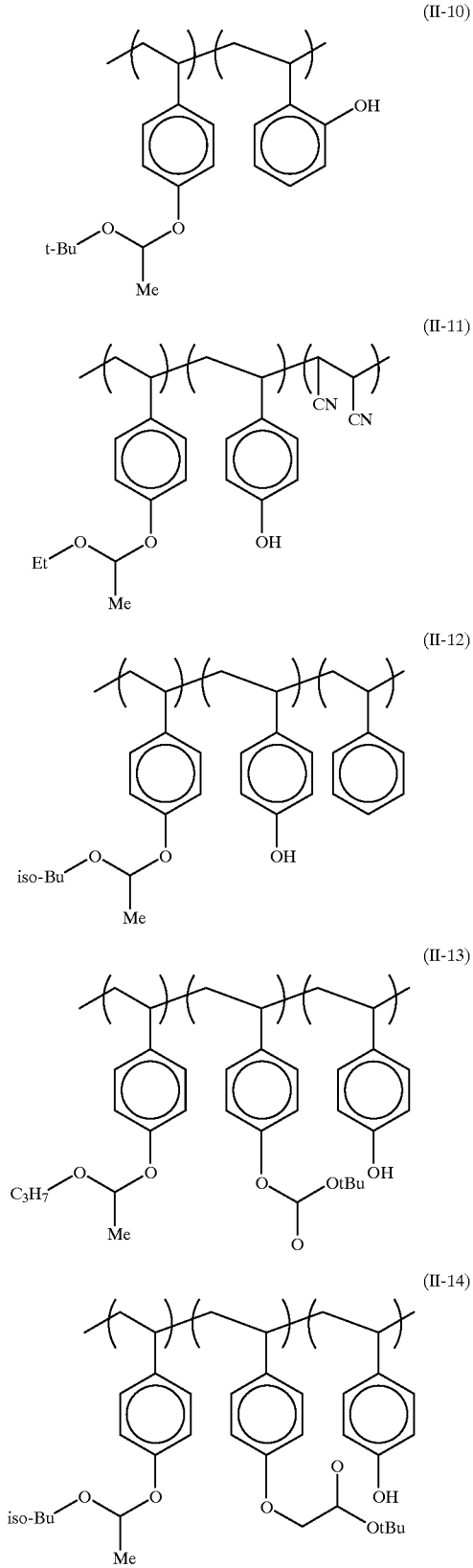
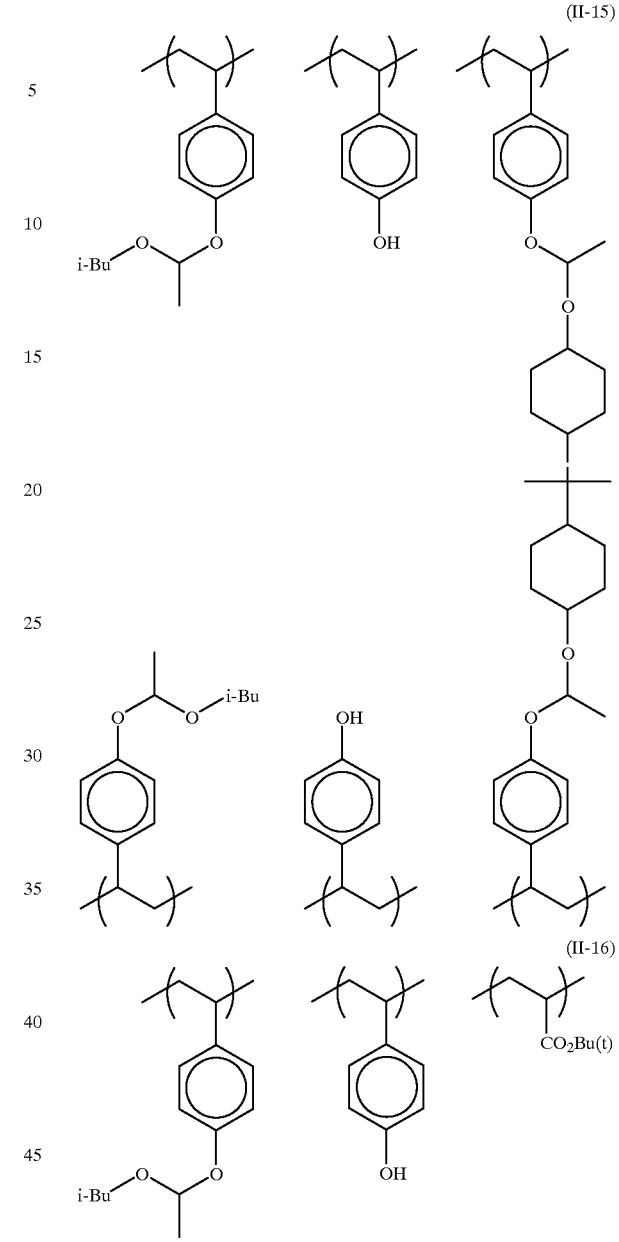

In the foregoing specific examples, Me represents a methyl group, Et represents an ethyl group, nBu represents a n-butyl group, iso-Bu represents an isobutyl group, and tBu represents a t-butyl group.

If as the acid-decomposable group there is used an acetal group, a polyhydroxy compound may be added in the stage of synthesis to introduce crosslinking sites at which polymer main chains are connected to each other via polyfunctional acetal group to adjust the alkali dissolution rate and enhance the heat resistance. The amount of the polyhydroxy compound to be added is preferably from 0.01 to 5 mol %, more preferably from 0.05 to 4 mol % based on the amount of the hydroxyl group in the resin. As the polyhydroxy group there may be used a polyhydroxy group containing from 2 to 6, preferably from 2 to 4, more preferably from 2 to 3 phenolic hydroxyl groups or alcoholic hydroxyl groups. Specific examples of the polyhydroxy compound will be given below, but the present invention should not be construed as being limited thereto.

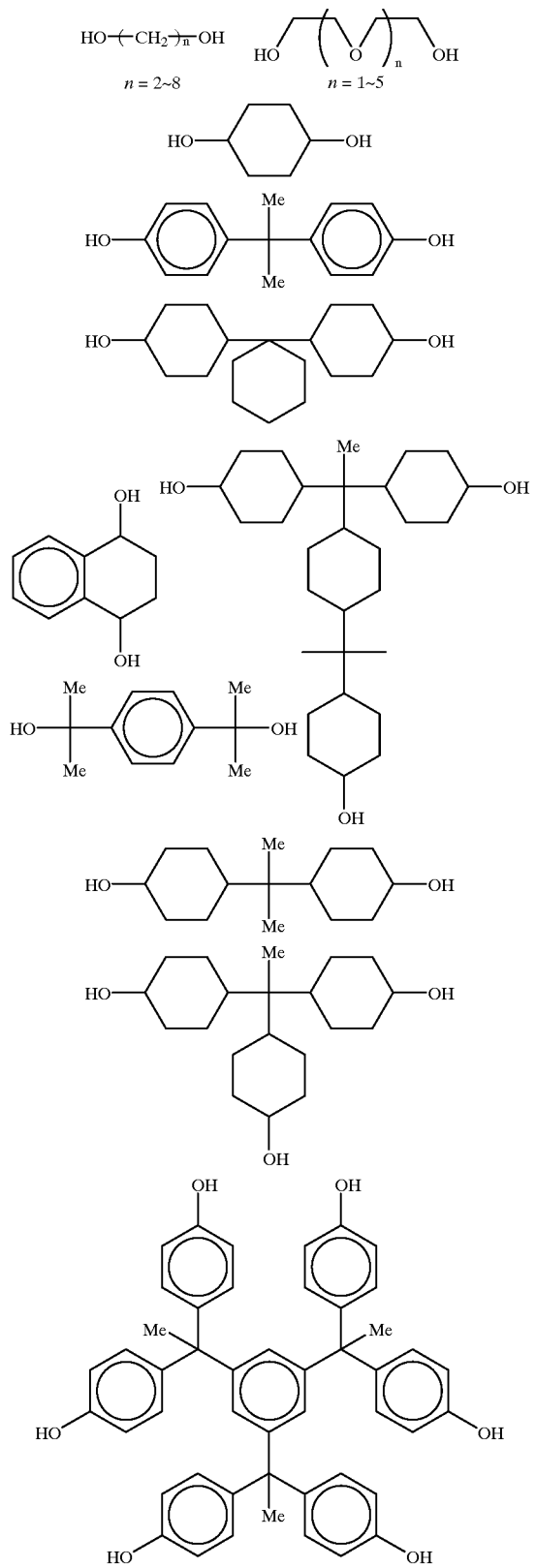

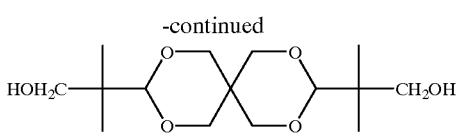

The weight-average molecular weight (Mw) of the resin containing an acid-decomposable group is preferably from 2,000 to 300,000. If the weight-average molecular weight (Mw) of the resin containing an acid-decomposable group falls below 2,000, the thickness of the photosensitive composition is reduced when the unexposed area is developed. On the contrary, if the weight-average molecular weight (Mw) of the resin containing an acid-decomposable group exceeds 300,000, the rate at which the resin itself is dissolved in an alkali is reduced, lowering the sensitivity. The weight-average molecular weight (Mw) of the resin containing an acid-decomposable group is determined by gel permeation chromatography as calculated in terms of polystyrene.

Two or more components (c) of the photosensitive composition of the present invention, i.e., resins containing an acid-decomposable group may be used in admixture. The amount of the component (c) to be used is from 40 to 99% by weight, preferably from 60 to 98% by weight based on the total weight of the photosensitive composition (excluding solvent).

[V] (d) Low Molecular Dissolution Inhibitive Compound

The photosensitive composition of the present invention may comprise a low molecular acid-decomposable dissolution inhibitive compound (d) (hereinafter occasionally referred to as "component (d)") incorporated therein. The component (d) is a low molecular compound with a molecular weight of not more than 3, 000, preferably from 200 to 2, 000, more preferably from 300 to 1,500 containing an acid-decomposable group which increases its solubility in an alkaline developer when acted on by an acid.

The content of the composition (d), if the resin containing an acid-decomposable group and the photo-acid generator are used in combination, is preferably from 3 to 45% by weight, more preferably from 5 to 30% by weight, particularly from 10 to 20% by weight, based on the total weight of the photosensitive composition (excluding solvent).

The component (d), i.e., acid-decomposable dissolution inhibitive compound is preferably a compound containing at least two acid-decomposable groups in its structure wherein at least 8 connecting atoms other than acid-decomposable group are interposed between the acid-decomposable groups which are separated from each other at the greatest distance.

Preferred examples of the foregoing acid-decomposable dissolution inhibitive compound include (a) a compound containing at least two acid-decomposable groups in its structure wherein at least 10, preferably at least 11, more preferably at least 12 connecting atoms other than acid-decomposable group are interposed between the acid-decomposable groups which are separated from each other at the greatest distance, and (b) a compound containing at least three acid-decomposable groups in its structure wherein at least 9, preferably at least 10, more preferably at least 11 connecting atoms other than acid-decomposable group are interposed between the acid-decomposable groups which are separated from each other at the greatest distance.

The upper limit of the number of the foregoing connecting atoms is preferably 50, more preferably 30.

If the acid-decomposable dissolution inhibitive compound contains three or more, preferably four or more acid-decomposable groups, even two acid-decomposable groups, its capacity of inhibiting dissolution in an alkali-soluble resin is remarkably enhanced as far as these acid-decomposable groups are separated from each other at a predetermined or greater distance.

The distance between the acid-decomposable groups is represented by the number of connecting atoms interposed therebetween excluding the acid-decomposable groups. In the case of the following compounds (1) and (2) for example, the distance between the acid-decomposable groups is four connecting atoms. In the case of the following compound (3), the distance between the acid-decomposable groups is 12 connecting atoms.

The alkyl group represented by $R^{01}$, $R^{02}$, $R^{03}$, $R^{04}$ or $R^{05}$ is preferably a $C_{1-4}$ alkyl group such as methyl, ethyl, propyl, n-butyl, sec-butyl and t-butyl. The cycloalkyl group represented by $R^{01}$, $R^{02}$, $R^{03}$, $R^{04}$ or $R^{05}$ is preferably a $C_{3-10}$ cycloalkyl group such as cyclopropyl, cyclobutyl, cyclohexyl and adamantyl. The alkenyl group represented by $R^{01}$, $R^{02}$, $R^{03}$, $R^{04}$ or $R^{05}$ is preferably a $C_{2-4}$ alkenyl group such as vinyl, propenyl, allyl and butenyl. The aryl group represented by $R^{01}$, $R^{02}$, $R^{03}$, $R^{04}$ or $R^{05}$ is preferably a $C_{6-14}$ aryl group such as phenyl, xylyl, toluyl, cumenyl, naphthyl and anthracenyl.

Examples of substituents on these groups include halogen atom (fluorine, chlorine, bromine, iodine), nitro group, cyano group, the foregoing alkyl group, alkoxy group such as methoxy, ethoxy, hydroxyethoxy, propoxy, hydroxypropoxy, n-butoxy, isobutoxy, sec-butoxy and t-butoxy, alkoxycarbonyl group such as methoxycarbonyl and ethoxycarbonyl, aralkyl group such as benzyl, phenethyl and cumyl, aralkyloxy group, acyl group such as formyl, acetyl, butyryl, benzoyl, cyanamyl and valeryl, acyloxy group such as butyryloxy, the foregoing alkenyl group, alkenyloxy group such as vinyloxy, propenyloxy, allyloxy

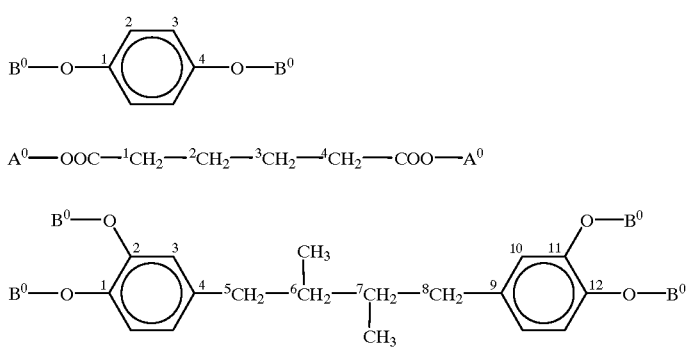

Acid-decomposable group: —COO—$A^0$, —O—$B^0$

Further, the acid-decomposable dissolution inhibitive compound may have a plurality of acid-decomposable groups on one benzene ring. Preferably, it is a compound formed by a skeleton having one acid-decomposable group on one benzene ring.

An example of the acid-decomposable group, i.e., group containing —COO—$A^0$ group or —O—$B^0$ group is a group represented by the general formula —$R^0$—COO—$A^0$ or —Ar—O—$B^0$.

$A^0$ represents —C($R^{01}$)($R^{02}$)($R^{03}$), —Si($R^{01}$)($R^{02}$)($R^{03}$) or —C($R^{04}$)($R^{05}$)—O—$R^{06}$ group. $B^0$ represents $A^0$ or —CO—O—$A^0$ group.

$R^{01}$, $R^{02}$, $R^{03}$, $R^{04}$ and $R^{05}$ may be the same or different and each represent a hydrogen atom, alkyl group, cycloalkyl group, alkenyl group or aryl group, and $R^{06}$ represents an alkyl or aryl group, with the proviso that at least two of $R^{01}$ to $R^{03}$ are groups other than hydrogen atom and two of $R^{01}$ to $R^{03}$ and $R^{04}$ to $R^{06}$ may be connected to each other to form a ring. $R^0$ represents a divalent or higher aliphatic or aromatic hydrocarbon group which may contain substituents. —Ar— represents a divalent or higher aromatic group which may contain monocyclic or polycyclic substituents.

and butenyloxy, the foregoing aryl group, aryloxy group such as phenoxy, and aryloxycarbonyl group such as benzoyloxy.

Preferred examples of the acid-decomposable group include silylether group, cumylester group, acetal group, tetrahydropyranylether group, enolether group, enol ester group, tertiary alkyl ether group, tertiary alkyl ester group, and tertiary alkylcarbonate group. Preferred among these acid-decomposable groups are tertiary alkyl ester group, tertiary alkylcarbonate group, cumylester group, and tetrahydropyranylether group.

The component (d) includes a compound protected by connecting some or all of phenolic hydroxyl groups in polyhydroxy compounds described in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, Japanese Patent Application No. 3-33229, Japanese Patent Application No. 3-230790, Japanese Patent Application No. 3-320438, Japanese Patent Application No. 4-25157, Japanese Patent Application No. 4-52732, Japanese Patent Application No. 4-103215, Japanese Patent Application No. 4-104542, Japanese Patent Application No. 4-107885, Japanese Patent Application No. 4-107889, and Japanese Patent Application No. 4-152195 via the foregoing group —R⁰—COO—A⁰ or B⁰.

Preferred among these compounds are those comprising polyhydroxy compounds described in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, Japanese Patent Application No. 4-25157, Japanese Patent Application No. 4-103215, Japanese Patent Application No. 4-104542, Japanese Patent Application No. 4-107885, Japanese Patent Application No. 4-107889, and Japanese Patent Application No. 4-152195.

Specific examples of these compounds include those represented by the following general formulae [I] to [XI]:

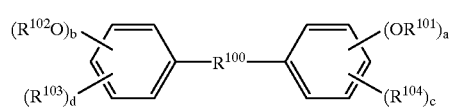

[I]

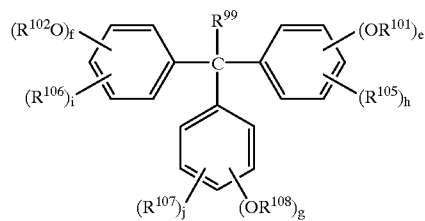

[II]

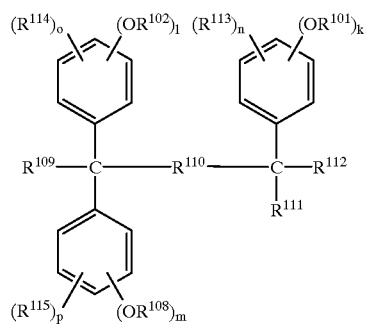

[III]

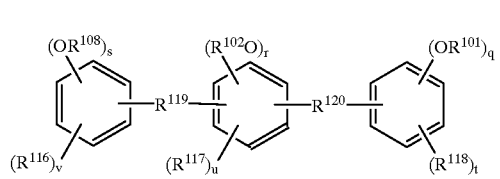

[IV]

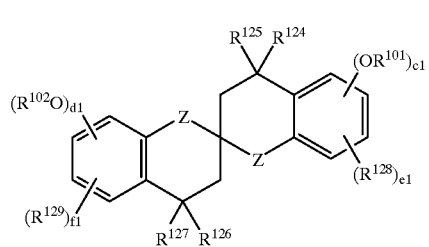

[V]

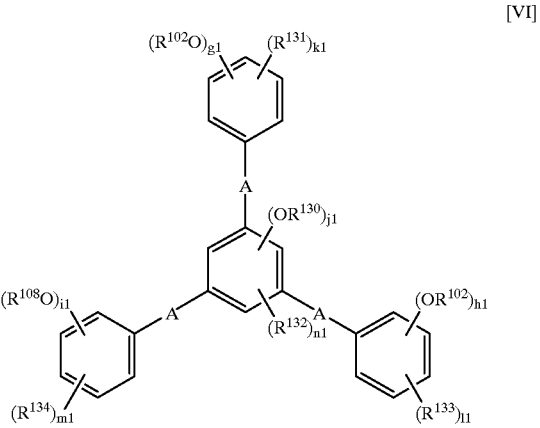

[VI]

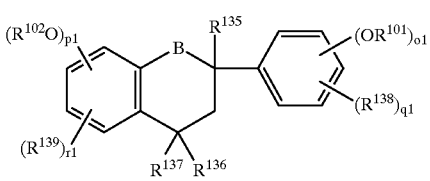

[VII]

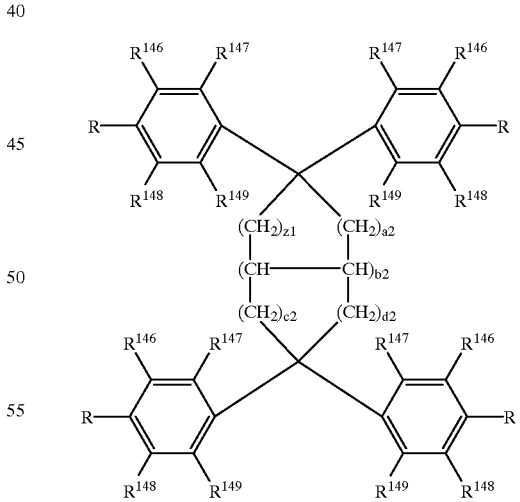

[VIII]

wherein $R^{101}$, $R^{102}$, $R^{108}$ and $R^{130}$ may be the same or different and each represent a hydrogen atom, —R⁰—COO—C($R^{01}$) ($R^{02}$) ($R^{03}$) or —CO—O—C($R^{01}$) ($R^{02}$) ($R^{03}$) (in which $R^0$, $R^{01}$, $R^{02}$ and $R^{03}$ are as defined above); $R^{100}$ represents —CO—, —COO—, —NHCONH—, —NHCOO—, —O—, —S—, —SO—, —$SO_2$—, —$SO_3$— or

[ka-36]

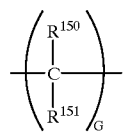

wherein G represents an integer of from 2 to 6, with the proviso that when G is 2, at least one of $R^{150}$ and $R^{151}$ is an alkyl group; $R^{150}$ and $R^{151}$ may be the same or different and each represent a hydrogen atom, alkyl group, alkoxy group, —OH, —COOH, —CN, halogen atom, —$R^{152}$—COO$R^{153}$ or —$R^{154}$—OH; $R^{152}$ and $R^{154}$ each represent an alkylene group; $R^{153}$ represents a hydrogen atom, alkyl group, aryl group or aralkyl group; $R^{99}$, $R^{103}$ to $R^{107}$, $R^{109}$, $R^{111}$ to $R^{118}$, $R^{128}$ to $R^{129}$, $R^{131}$ to $R^{134}$, $R^{138}$ and $R^{139}$ may be the same or different and each represent a hydrogen atom, hydroxyl group, alkyl group, alkoxy group, acyl group, acyloxy group, aryl group, aryloxy group, aralkyl group, aralkyloxy group, halogen atom, nitro group, carboxyl group, cyano group or —N($R^{155}$) ($R^{156}$) (in which $R^{155}$ and $R^{156}$ each represent a hydrogen atom, alkyl group or aryl group); $R^{110}$ represents a single bond, alkyl group or

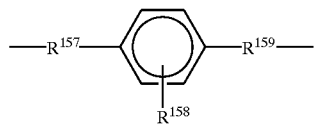

wherein $R^{157}$ and $R^{159}$ maybe the same or different and each represent a single bond, alkylene group, —O—, —S—, —CO— or carboxyl group; and $R^{158}$ represents a hydrogen atom, alkyl group, alkoxy group, acyl group, acyloxygroup, aryl group, nitro group, hydroxyl group, cyano group or carboxyl group, with the proviso that the hydroxyl group may be replaced by an acid-decomposable group (e.g., t-butoxycarbonylmethyl, tetrahydropyranyl, 1-ethoxy-1-ethyl, 1-t-butoxy-1-ethyl); $R^{119}$ and $R^{120}$ may be the same or different and each represent a methylene group, lower alkyl-substituted methylene group, halomethylene group or haloalkyl group, with the proviso that the term "lower alkyl group" as used herein is meant to indicate a $C_{1-4}$ alkyl group; $R^{124}$ to $R^{127}$ may be the same or different and each represent a hydrogen atom or alkyl group; $R^{135}$ to $R^{137}$ may be the same or different and each represent a hydrogen atom, alkyl group, alkoxy group, acyl group or acyloxy group; $R^{146}$ to $R^{149}$ may be the same or different and each represent a hydrogen atom, hydroxyl group, halogen atom, nitro group, cyano group, carbonyl group, alkyl group, alkoxy group, alkoxycarbonyl group, aralkyl group, aralkyloxy group, acyl group, acyloxy group, alkenyl group, alkenyloxy group, aryl group, aryloxy group or aryloxycarbonyl group, with the proviso that the four substituents having the same symbol may be the same or different; Z and B each represent a single bond or —O—; A represents a methylene group, lower alkyl-substituted methylene group, halomethylene group or haloalkyl group, with the proviso that when a to v, and c1 to r1 are plural, the groups in parenthesis may be the same or different; a to q, s, t, v, g1 to i1, k1 to m1, o1, and q1 each represent 0 or an integer of from 1 to 5; r, u, w, x, y, z, c1 to f1, p1, and r1 each represent 0 or an integer of from 1 to 4; and j1, n1, z1, a2, b2, c2, and d2 each represent 0 or an integer of from 1 to 3, with the proviso that at least one of a2, c2 and d2 represents an integer of not less than 1 and all these suffixes satisfy the following relationships:

(a+b), (e+f+g), (k+1+m), (q+r+s), (c1+d1), (g1+h1+i1+j1), (o1+p1)$\geq$2, (j1+n1)$\leq$3, (r+u), (c1+e1), (d1+f1), (p1+r1)$\leq$4, (a+c), (b+d), (e+h), (f+i), (g+j), (k+n), (l+o), (m+p), (q+t), (s+v), (g1+k1), (h1+l1), (i1+m1), (o1+q1) $\leq$5

[IX]

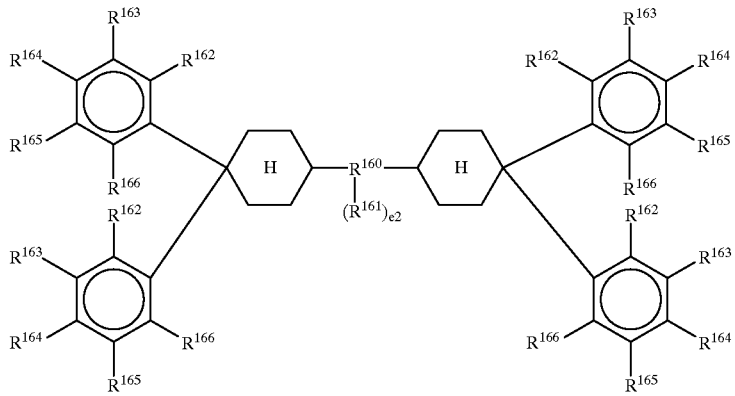

wherein $R^{160}$ represents an organic group, single bond, —S—, —SO—

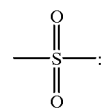

$R^{161}$ represents a hydrogen atom, monovalent organic group or

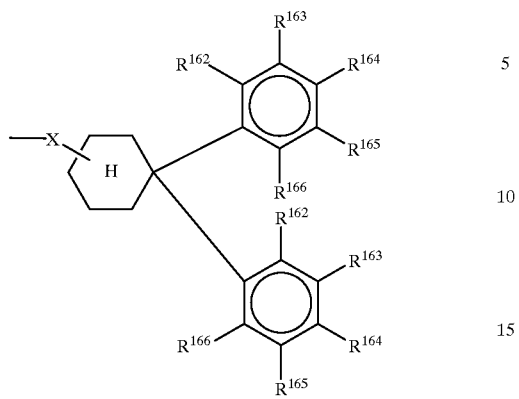

wherein $R^{162}$ to $R^{166}$ may be the same or different and each represent a hydrogen atom, hydroxyl group, halogen atom, alkyl group, alkoxy group, alkenyl group, —O—$R^0$—COO—C ($R^{01}$) ($R^{02}$) ($R^{03}$) or —O—CO—O—C($R^0$) ($R^{02}$) ($R^{03}$), with the proviso that at least two of $R^{162}$ to $R^{166}$ each are —O—$R^0$—COO—C($R^{01}$) ($R^{02}$) ($R^{03}$) or —O—CO—O—C($R^{01}$) ($R^{02}$) ($R^{03}$) and the four or six substituents having the same symbol may be the same or different; X represents a divalent organic group; and e2 represents 0 or 1, wherein $R^{167}$ to $R^{170}$ may be the same or different and each represent a hydrogen atom, hydroxyl group, halogen atom, alkyl group, alkoxy group or alkenyl group, with the proviso that the four to six substituents having the same symbol may be the same or different; $R^{171}$ and $R^{172}$ each represent a hydrogen atom, alkyl group or

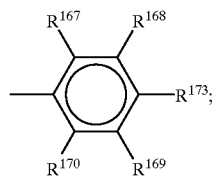

at least two of $R^{173}$'s each represent —O—$R^0$—COO—C ($R^{01}$) ($R^{02}$) ($R^{03}$) or —O—CO—O—C($R^{01}$) ($R^{02}$) ($R^{03}$) group and the other each represent a hydroxyl group; f2 and h2 each represent 0 or 1; and g2 represents 0 or an integer of from 1 to 4

[X]

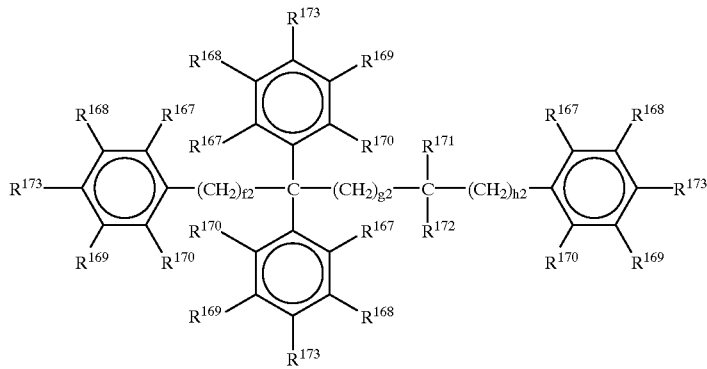

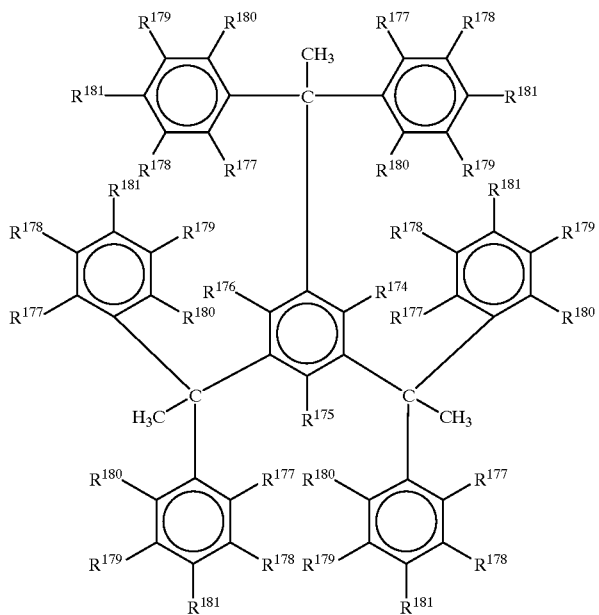

[XI]

wherein $R^{174}$ to $R^{180}$ may be the same or different and each represent a hydrogen atom, hydroxyl group, halogen atom, alkyl group, alkoxy group, nitro group, alkenyl group, aryl group, aralkyl group, alkoxycarbonyl group, arylcarbonyl group, acyloxy group, acyl group, aralkyloxy group or aryloxy group, with the proviso that the six substituents having the same symbol may be the same or different; and at least two of $R^{181}$'s each represent —O—$R^0$—COO—C($R^{01}$) ($R^{02}$) ($R^{03}$) or —O—CO—O—C($R^{01}$) ($R^{02}$) ($R^{03}$) group and the other each represent a hydroxyl group.

Specific examples of preferred compound skeletons will be given below.

(1)

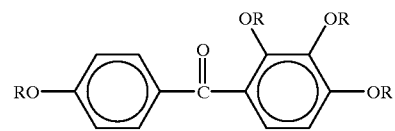

(2)

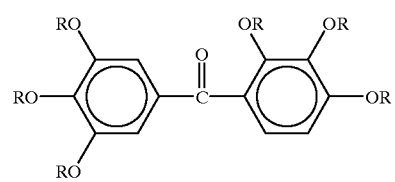

(3)

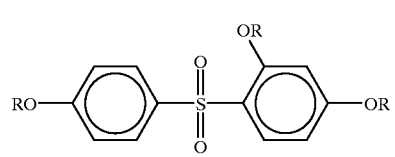

-continued (4)

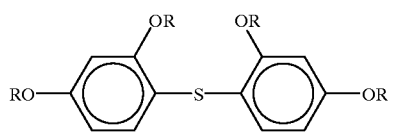

(5)

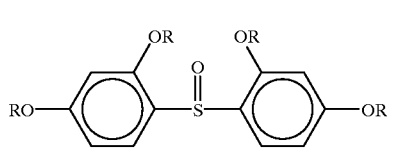

(6)

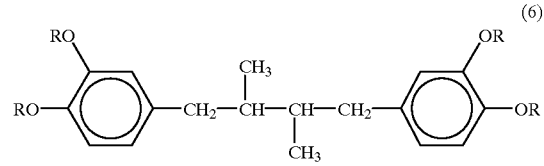

(7)

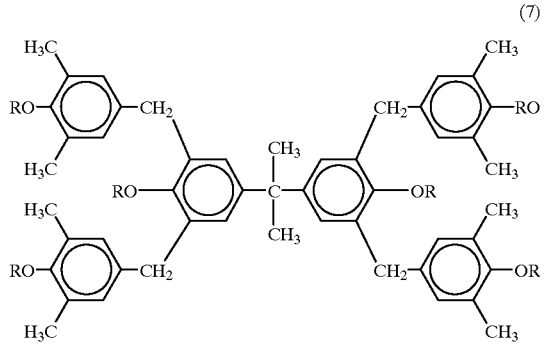

-continued
(8)
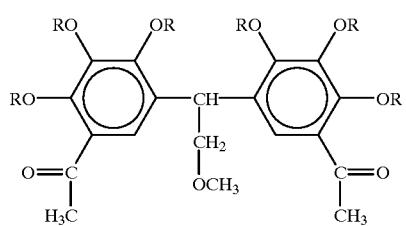
(9)
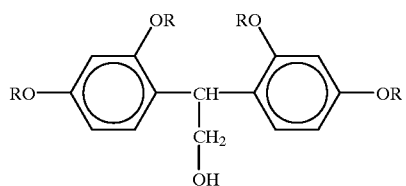
(10)
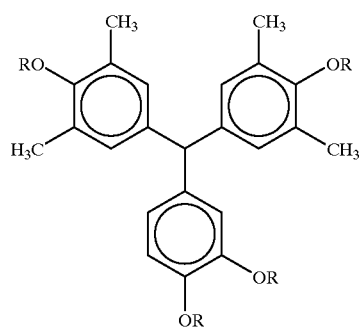
(11)
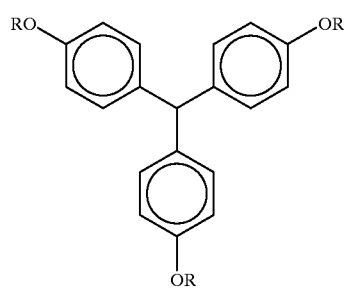
(12)
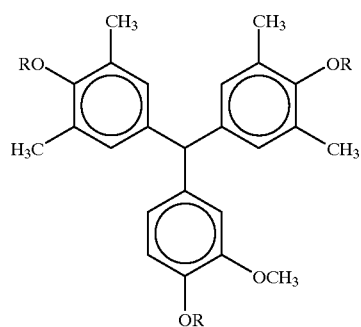
-continued
(13)
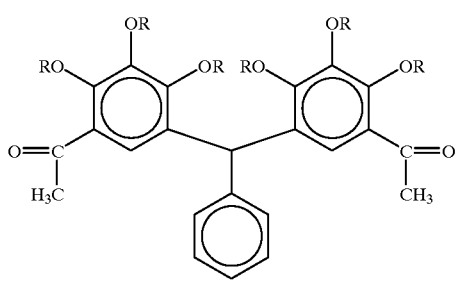
(14)
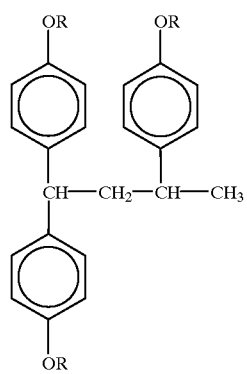
(15)
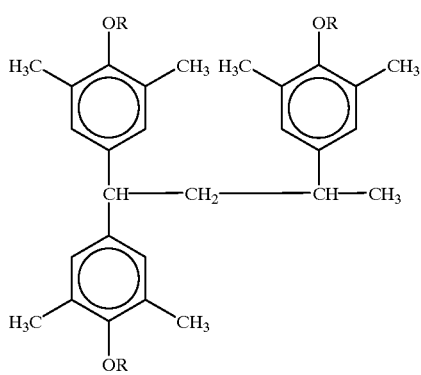
(16)
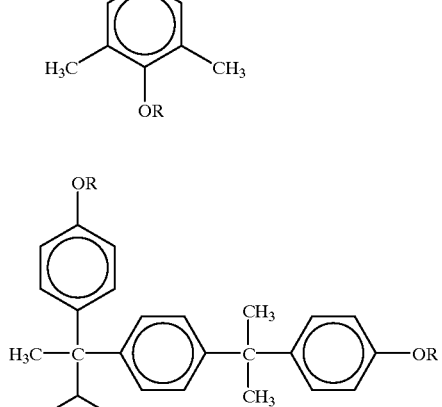

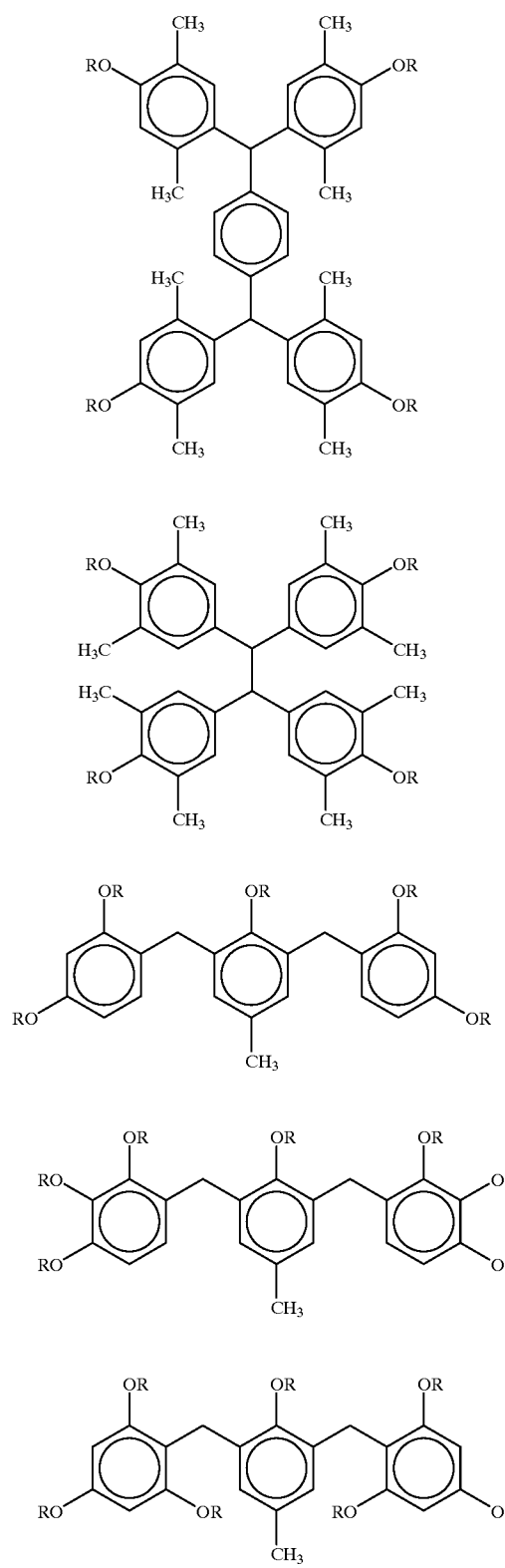
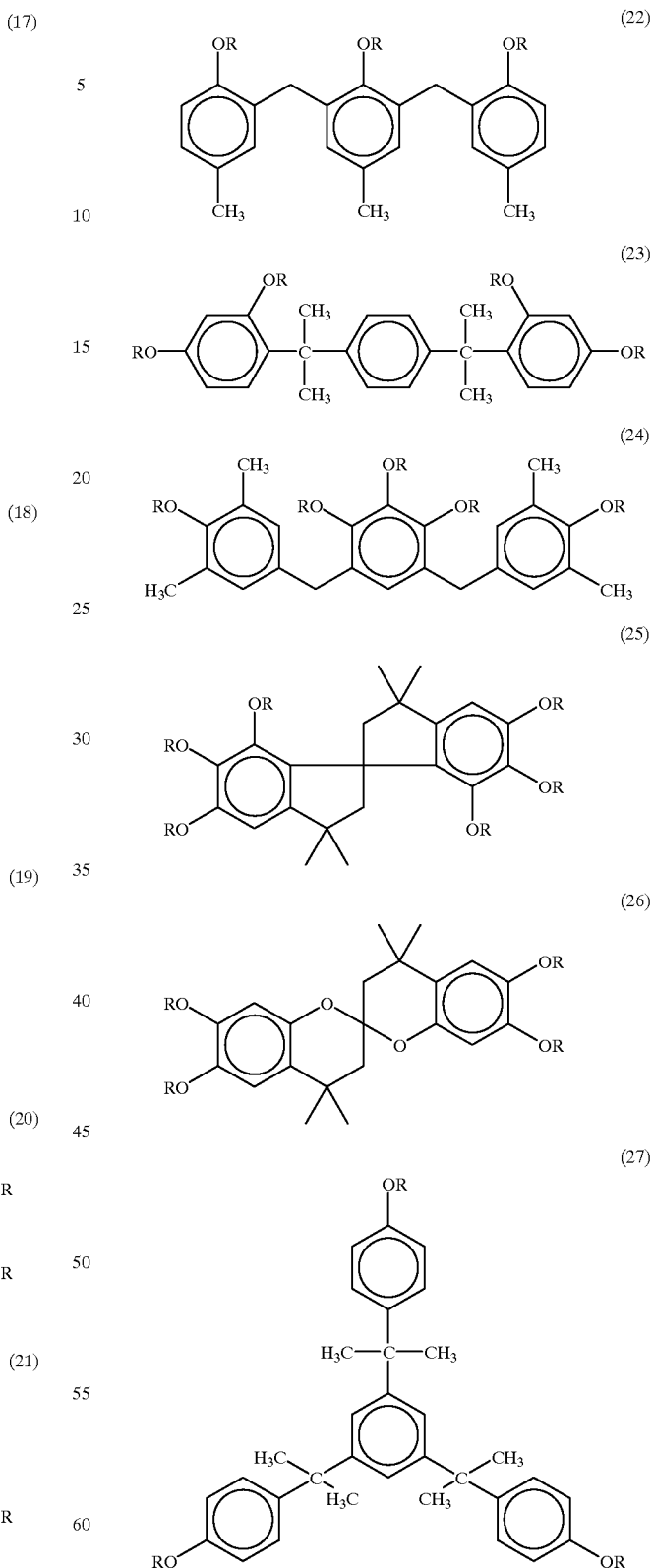

(28)
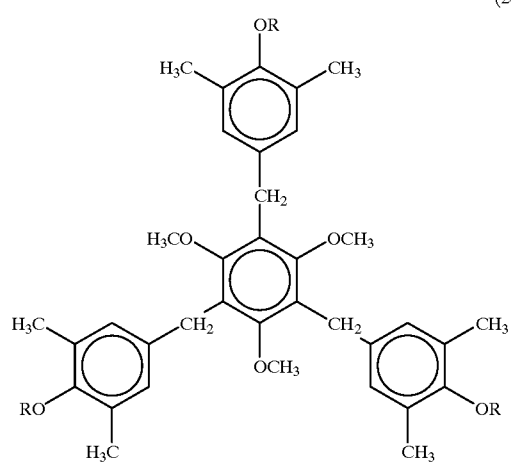
(29)
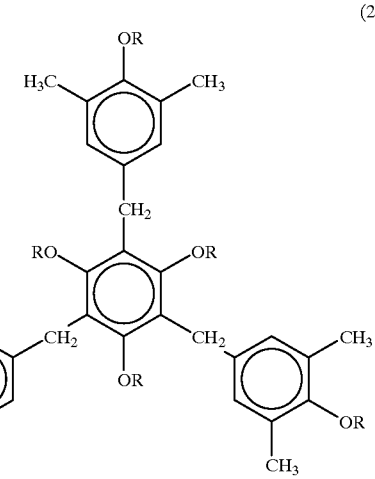
(30)
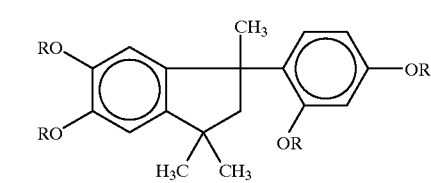
(31)
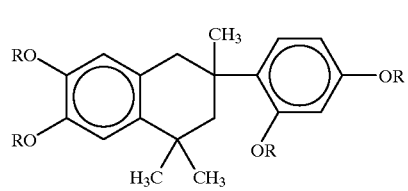
(32)
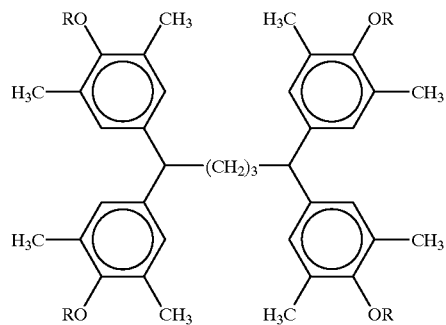
(33)
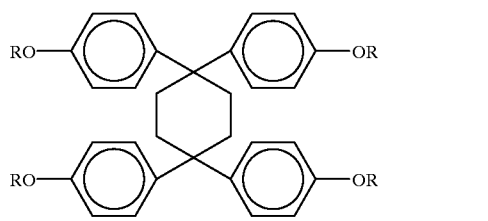
(34)
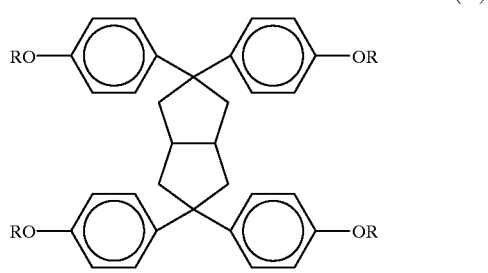
(35)
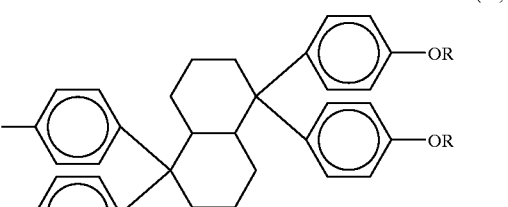
(36)
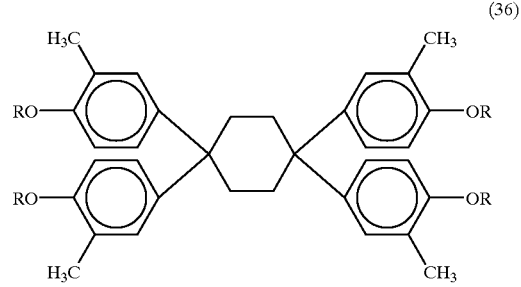

(37)
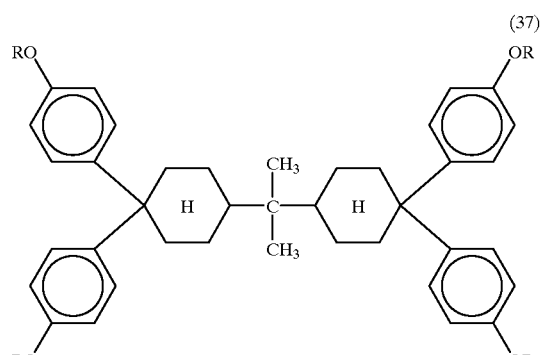
(38)
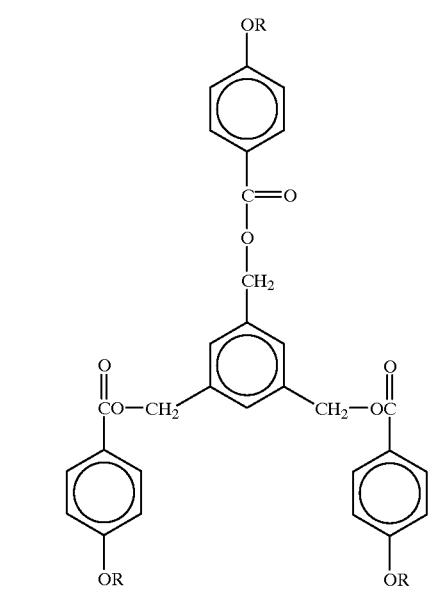
(39)
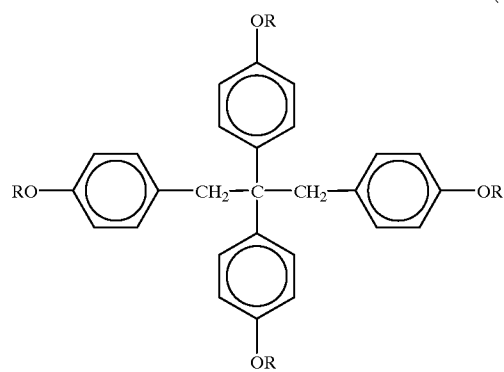
(40)
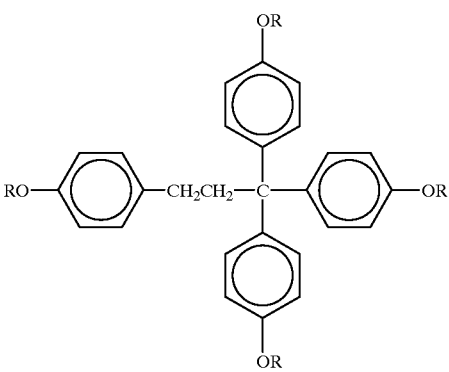
(41)
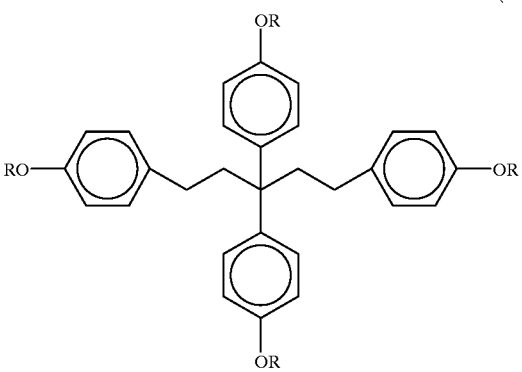
(42)
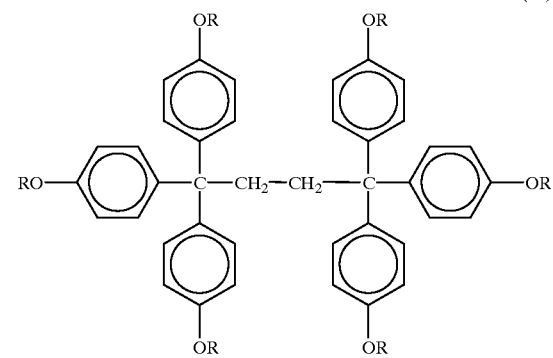
(43)
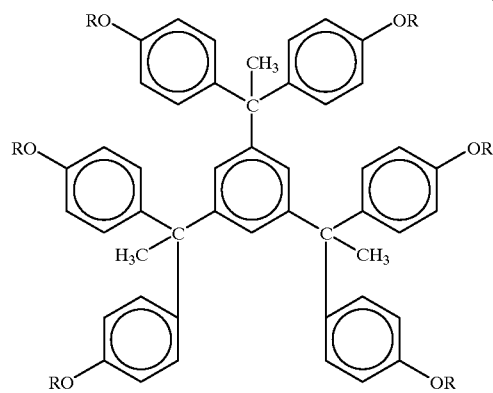

(44)

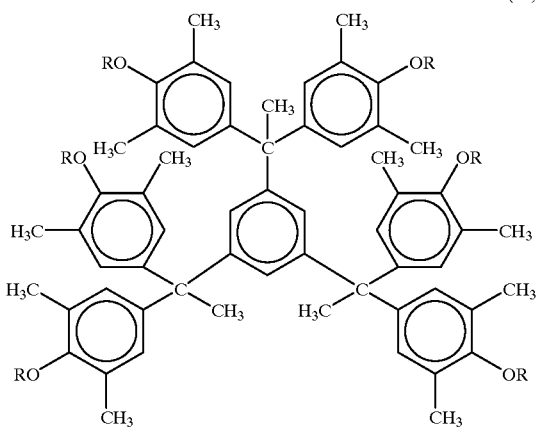

In the foregoing general formulae (1) to (44), R represents a hydrogen atom,

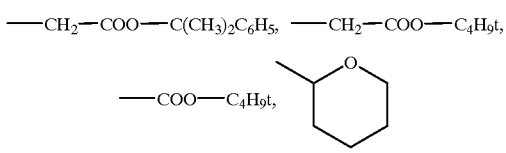

with the proviso that at least two or three, depending on the structure, of R's are groups other than hydrogen atom and the various substituents R may be the same or different.

In the present invention, the added amount of the foregoing dissolution inhibitive compound, if combined with a photo-acid generator and an alkali-soluble resin, is from 3 to 50% by weight, preferably from 5 to 40% by weight, more preferably from 10 to 35% by weight based on the total weight of the photosensitive composition (excluding solvent).

[VI] Resin (e) Insoluble in Water But Soluble in Alkaline Developer

The composition of the present invention may comprise a water-insoluble and alkaline developer-soluble resin (hereinafter occasionally referred to as "component (e)") incorporated therein to adjust its alkali solubility. This resin is substantially free of acid-decomposable group.

Examples of the component (e) include novolak resin, hydrogenated novolak resin, acetone-pyrogallol resin, o-polyhydroxystyrene, m-polyhydroxystyrene, p-polyhydroxystyrene, hydrogenated polyhydroxystyrene, halogen- or alkyl-substituted polyhydroxystyrene, hydroxystyrene-N-substituted maleimide copolymer, o/p- or m/p-hydroxystyrene copolymer, product of partial O-alkylation of hydroxyl group in polyhydroxystyrene (e.g., 5 to 30 mol % O-methylation product, O-(1-methoxy) ethylation product, O-(1-ethoxy)ethylation product, O-2-tetrahydropyranylation product, O-(t-butoxycarbonyl) methylation product), product of partial O-acylation of hydroxyl group in polyhydroxystyrene (e.g., 5 to 30 mol % O-acetylation product, O-(t-butoxy) carbonylation product), styrene-maleic anhydride copolymer, styrene-hydroxystyrene copolymer, α-methylstyrene-hydroxystyrene copolymer, carboxyl group-containing methacrylic resin, derivative thereof, and polyvinyl alcohol derivative. However, the present invention is not limited to these compounds.

Particularly preferred among these alkali-soluble resins are novolak resin, o-polyhydroxystyrene, m-polyhydroxystyrene, p-polyhydroxystyrene, copolymer thereof, alkyl-substituted polyhydroxystyrene, partial O-alkylation product of polyhydroxystyrene, partial O-acylation product of polyhydroxystyrene, styrene-hydroxystyrene copolymer, and α-methylstyrene-hydroxystyrene copolymer. The foregoing novolak resin can be obtained by allowing a specific monomer as a main component to undergo addition condensation reaction with aldehydes in the presence of an acid catalyst.

The weight-average molecular weight of the novolak resin is preferably from 1,000 to 30,000. If the weight-average molecular weight of the novolak resin falls below 1,000, the thickness of the photosensitive composition is reduced when the unexposed area is developed. On the contrary, if the weight-average molecular weight of the novolak resin exceeds 300,000, the development rate is reduced. A particularly preferred range of the weight-average molecular weight of the novolak resin is from 2,000 to 20,000.

The weight-average molecular weight of the foregoing polyhydroxystyrene or derivative or copolymer thereof is not less than 2,000, preferably from 5,000 to 200,000, more preferably from 8,000 to 100,000. It is preferably not less than 10,000 from the standpoint of enhancement of heat resistance of resist layer.

The weight-average molecular weight of the novolak resin is determined by gel permeation chromatography as calculated in terms of polystyrene.

Two or more of these alkali-soluble resins of the present invention may be used in admixture. The amount of the alkali-soluble resin to be used is from 40 to 97% by weight, preferably from 60 to 90% by weight based on the total weight of the photosensitive composition (excluding solvent).

[VII] Other Components Employable in the Present Invention

The positive-working photosensitive composition of the present invention may further comprise a dye, a pigment, a plasticizer, a surface active agent, a photosensitizer, a compound containing two or more phenolic OH groups which accelerate solubility in a developer, etc. incorporated therein as necessary.

The compound containing two or more phenolic OH groups employable herein is preferably a phenol compound having a molecular weight of not more than 1,000. The phenol compound needs to contain at least two phenolic hydroxyl groups in its molecule. However, if the number of phenolic hydroxyl groups contained in the phenol compound exceeds 10, the desired effect of improving development latitude is lost. Further, if the ratio of phenolic hydroxyl group to aromatic ring falls below 0.5, the resulting dependence on the film thickness is too great and the development latitude tends to narrow. On the contrary, if this ratio exceeds 1.4, the resulting photosensitive composition exhibits a deteriorated stability, making it difficult to obtain a high resolution and a good dependence on the film thickness.

The added amount of the phenolic compound is preferably from 2 to 50% by weight, more preferably from 5 to 30% by weight based on the weight of the alkali-soluble resin. If the added amount of the phenolic compound exceeds 50% by weight, it increases development residue, and a new defect occurs that the pattern is deformed during development.

The synthesis of the phenol compound having a molecular weight of not more than 1,000 can be easily accomplished by those skilled in the art in accordance with the method described in JP-A-4-122938, JP-A-2-28531, U.S. Pat. No. 4,916,210, and European Patent 219,294.

Specific examples of the phenol compound will be given below, but the present invention should not be construed as being limited thereto.

Resorcin, phloroglucine, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucoside, 2,4,2',4'-biphenyltetrol, 4,4'-thiobis (1,3-dihydroxy)benzene, 2,2',4,4'-tetrahydroxydiphenylether, 2,2',4,4'-tetrahydroxy diphenylsulfoxide, 2,2',4,4'-tetrahydroxydiphenyl sulfoxide, 2,2',4,4'-tetrahydroxydiphenylsulfone, tris(4-hydroxyphenyl)methane, 1,1-bis(4-hydroxyphenyl) cyclohexane, 4,4-(α-methylbenzylidene)bisphenol, α,α',α"-tris (4-hydroxyphenyl)-1,3,5-triisopropylbenzene, α,α',α"-tris(4-hydroxyphenyl)-1-ethyl-4-isopropylbenzene, 1,2,2-tris (hydroxyphenyl)propane, 1,1,2-tris(3,5-dimethyl-4-hydroxy phenyl)propane, 2,2,5,5-tetrakis(4-hydroxyphenyl) hexane, 1,2-tetrakis(4-hydroxyphenyl)ethane, 1,1,3-tris (hydroxyphenyl)butane, and para[α,α,α',α'-tetrakis(4-hydroxyphenyl)]-xylene.

Preferred examples of the foregoing dye include oil-based dyes and basic dyes. Specific examples of these dyes include oil yellow #101, oil yellow #103, oil pink #312, oil green BG, oil blue BOS, oil blue #603, oil black BY, oil black BS, oil black T-505 (produced by Orient Chemical Industries Limited), crystal violet (CI42555), methylviolet (CI42535), rhodamine B (CI45170B), malachite green (CI42000), and methylene blue (CI52015).

The photosensitive composition of the present invention may further comprise a spectral sensitizer described below incorporated therein so that it is sensitized to a wavelength range longer than far ultraviolet range where the photo-acid generator has no absorption to render itself sensitive to i- or g-ray. Specific examples of preferred spectral sensitizers include benzophenone, p,p'-tetramethyldiaminobenzophenone, p,p'-tetraethylethylamino benzophenone, 2-chlorothioxanthone, anthrone, 9-ethoxyanthracene, anthracene, pyrene, perylene, phenothiazine, benzyl, acridine orange, benzoflavine, cetoflavine-T, 9,10-diphenylanthracene, 9-fluorenone, acetophenone, phenanthrene, 2-nitrofluorenone, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethyl anthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin), and coronene. However, the present invention is not limited to these spectral sensitizers.

These spectral sensitizers may be used also as absorbent of far ultraviolet rays from the light source. In this case, the light absorbent lessens the light reflected by the substrate to minimize the effect of multiple reflection in the resist layer and hence exert an effect of eliminating standing wave.

The photosensitive composition of the present invention may be applied to the support in the form of solution in a solvent capable of dissolving the various components therein. Preferred examples of the solvent employable herein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofurane. These solvents may be used singly or in admixture.

A surface active agent may be added to the foregoing solvent. Specific examples of the surface active agent employable herein include nonionic surface active agents such as polyoxyethylene alkyl ether (e.g., polyoxyethylene lauryl ether, polyoxyethylene stearyl ether, polyoxyethylene cetyl ether, polyoxyethylene oleyl ether), polyoxyethylene alkyl allyl ether (e.g., polyoxyethylene octyl phenol ether, polyoxyethylene nonyl phenol ether), polyoxyethylene-polyoxypropylene block copolymer, sorbitanaliphatic acid ester (e.g., sorbitan monolaurate, sorbitan monopalmitate, sorbitan monostearate, sorbitan monoleate, sorbitan trioleate, sorbitan tristearate) and polyoxyethylenesorbitan aliphatic acid ester (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate), fluorine surface active agents such as Eftop EF301, EF303, EF352 (produced by Tohkem Products Corp.), Megafac F171, F173 (produced by DAINIPPON INK & CHEMICALS, INC.), Florad FC430, FC431 (produced by Sumitomo 3M Corp.), Asahi Guard AG710 and SURFLON S-382, SC101, SC102, SC103, SC104, SC105, SC106 (produced by Asahi Glass Co., Ltd.), Organosiloxane polymer KP341 (produced by Shin-Etsu Chemical Co., Ltd.), and acrylic or methacrylic acid (co)polymer Polyflow Nos. 75 and 95 (produced by Kyoeisha Chemical Co., Ltd.). The blended amount of such a surface active agent is normally not more than 2 parts by weight, preferably not more than 1 part by weight based on 100 parts by weight of the solid content in the photosensitive composition of the present invention.

These surface active agents may be used singly. Alternatively, some of these surface active agents may be used in combination.

The photosensitive composition thus obtained may be applied to a substrate (e.g., silicon/silicon dioxide-coated substrate) for use in the production of precision integrated circuit device by means of an appropriate coating means such as spinner and coater, exposed to light through a predetermined mask, baked, and then developed to obtain a good resist pattern.

As the developer for the photosensitive composition of the present invention there may be used an aqueous solution of an alkaline material such as inorganic alkali (e.g., sodium hydroxide, potassium hydroxide, sodium carbonate, sodium silicate, sodium metasilicate, aqueous ammonia), primary amine (e.g., ethylamine, n-propylamine), secondary amine (e.g., diethylamine, di-n-butylamine), tertiary amine (e.g., triethylamine, methyldiethylamine), alcoholamine (e.g., dimethylethanolamine, triethanolamine), quaternary ammonium salt (e.g., tetramethylammonium hydroxide, tetraethylammonium hydroxide) and cyclic amine (e.g., pyrrole, piperidine).

The foregoing alkaline aqueous solution may comprise alcohols and surface active agents incorporated therein in a proper amount.

EXAMPLES

The present invention will be further described in the following examples, but the present invention should not be construed as being limited thereto.

(a) Basic Nitrogen-Containing Compounds

As the basic nitrogen-containing compounds there were used the foregoing exemplary compounds (I-1), (I-2), (I-3) and (I-4) (produced by Aldrich Corp.).

(b) Synthesis of Acid-Generating Compounds

Synthesis of Compound (II-1):

50 g of diphenyl sulfoxide was dissolved in 800 ml of benzene. To the solution thus obtained was then added 200 g of aluminum chloride. The mixture was then heated under reflux. The reaction solution was then slowly poured into 2 l of ice. To the mixture was then added 400 ml of concentrated hydrochloric acid. The mixture was then heated to a temperature of 70° C. for 10 minutes. The aqueous solution thus obtained was washed with 500 ml of ethyl acetate, and then filtered. To the filtrate was then added 400 ml of an aquesou solution containing 200 g of ammonium iodide. The resulting powder was collected by filtration, washed with water, washed with ethyl acetate, and then dried to obtain 70 g of triphenyl sulfonium iodide.

50 g of triphenyl sulfonium iodide thus obtained was then dissolved in 300 ml of methanol. To the solution thus obtained was then added 31 g of silver oxide. The mixture was then stirred for 4 hours. The reaction solution was then filtered. To the filtrate was then added 45 g of tetramethylammonium 2,4,6-triisopropylbenzenesulfonate (obtained by reacting 2,4,6-triisopropylbenzenesulfonyl chloride in tetramethyl ammonium hydroxide, water and methanol on heating). The solution thus obtained was concentrated to obtain a powder which was thoroughly washed with water, and then recrystallized from ethyl acetate/acetone to obtain 50 g of Compound (II-1).

Compounds (II-2) and (II-3) were synthesized in the manner similar to the above.

Synthesis of Compound (II-4):

To 50 g of diphenyl sulfoxide and 45 g of diphenyl sulfide was added 100 ml of a 10/1 mixture of methanesulfonic acid and diphosphorus pentaoxide. After the termination of heat generation, the mixture was heated to a temperature of 50° C. for 4 hours. The reaction solution was then poured into ice. The aqueous solution was washed with toluene, and then filtered. To the filtrate was then added 400 ml of an aqueous solution containing 200 g of ammonium iodide. The resulting powder was collected by filtration, and then washed with water to obtain diphenyl(4-phenylthiophenyl)sulfonium iodide.

Diphenyl(4-phenylthiophenyl)sulfonium iodide thus obtained was then subjected to salt replacement with 2-heptyloxycarbonylbenzenesulfonic acid (synthesized from o-sulfobenzoic anhydride and n-heptanol) in the same manner as in (II-1) to obtain Compound (II-4).

Compounds (III-1) and (III-2) were prepared in the manner similar to the above effecting salt replacement with the corresponding sulfonic acids.

Synthesis of Compound (IV-1):

60 g of t-amylbenzene, 39.5 g of potassium iodate, 81 g of acetic anhydride and 170 ml of dichloromethane were mixed. To the mixture was then slowly added dropwise 66.8 g of concentrated sulfuric acid under cooling with ice. The mixture was stirred under cooling with ice for 2 hours and then at room temperature overnight. To the reaction solution was then added dropwise 50 ml of water under cooling with ice. The mixture was then extracted with dichloromethane. The resulting organic phase was washed with water, an aqueous solution of sodium hydrogencarbonate and then water, and then concentrated to obtain di-t-amylphenyliodonium sulfate.

10 g of the sulfate thus obtained was then added to an aqueous solution of 10 g of tetramethylammonium 2,4,6-triisopropylbenzenesulfonate. The resulting powder was collected by filtration, and then washed with water to obtain a crude crystal. The crude crystal was then recrystallized from 2-propanol to obtain 5 g of Compound (IV-1).

Compound (IV-2) was prepared in the manner similar to the above.

(c) Synthesis of Resins

Resin Synthesis Example 1

Synthesis of PHS/iBES (60/40 (molar ratio) P-hydroxystyrene/P-(1-iso-butoxyethoxystyrene) copolymer):

500 g of a poly(p-hydroxystyrene) (VP-8000, produced by Nippon Soda Co., Ltd.; weight-average molecular weight: 11,000) was dissolved in 2,000 ml of dehydrated THF. To the solution thus obtained were then added 176 g of iso-butyl vinyl ether and 0.15 g of dehydrated p-toluenesulfonic acid. The mixture was then stirred at room temperature for 10 hours. To the reaction solution was then added 16 g of triethylamine. The mixture was then poured into 40 l of ion-exchanged water. The resulting powder was collected by filtration, washed with water, and then dried to obtain a 60/40 p-hydroxystyrene/p-(1-iso-butoxyethoxystyrene) copolymer.

Resin Synthesis Example 2

Synthesis of PHS/iBESB (70/30 (molar ratio) partially crosslinked P-hydroxystyrene/P-(1-iso-butoxyethoxy)styrene copolymer):

500 g of a poly(p-hydroxystyrene) (VP-8000, produced by Nippon Soda Co., Ltd.; weight-average molecular weight: 11,000) was dissolved in 2,000 ml of dehydrated THF. To the solution thus obtained were then added 166 g of iso-butyl vinyl ether, 40 g of 2,2-bis(4-hydroxycyclohexyl) propane and 0.15 g of dehydrated p-toluenesulfonic acid. The mixture was then stirred at room temperature for 10 hours. To the reaction solution was then added 16 g of triethylamine. The mixture was then poured into 40 l of ion-exchanged water. The resulting powder was collected by filtration, washed with water, and then dried to obtain a 70/30 partially crosslinked P-hydroxystyrene/P-(1-iso-butoxyethoxy)styrene copolymer.

Resin Synthesis Example 3

Synthesis of PHS/THPS (60/40 (molar ratio) p-hydroxystyrene/p-(2-tetrahydropyranyloxy)styrene copolymer:

The synthesis procedure of Synthesis Example 1 was followed except that 2,3-dihydro-4H-pyran was used instead of iso-butyl vinyl ether. Thus, a 60/40 p-hydroxystyrene/p-(2-tetrahydropyranyloxy)styrene copolymer was obtained.

Resin Synthesis Example 4

Synthesis of PHS/tBOCS (60/40 P-hydroxystyrene/P-(t-butyloxycarbonyl)styrene copolymer):

A poly(p-hydroxystyrene) (VP-8000, produced by Nippon Soda Co., Ltd.; weight-average molecular weight: 11,000) was dissolved in 40 ml of pyridine. To the solution thus obtained was then added 1.28 g of di-t-butyl dicarbonate. The mixture was then stirred at room temperature for 3 hours. The mixture was then poured into a solution of 20 g of concentrated hydrochloric acid in 1 l of ion-exchanged water. The resulting powder was collected by filtration, washed with water, and then dried to obtain a 60/40 P-hydroxystyrene/P-(t-butyloxycarbonyl)styrene copolymer.

Resin Synthesis Example 5
Synthesis of PHS/EES (55/45 (molar ratio) partially crosslinked p-hydroxystyrene/P-(1-ethoxyethoxy)styrene copolymer:

The synthesis procedure of Synthesis Example 2 was followed except that ethyl vinyl ether was used instead of t-butyl vinyl ether. Thus, a 55/45 partially crosslinked p-hydroxystyrene/p-(1-ethoxyethoxy)styrene copolymer was obtained.

Resin Synthesis Example 6
Synthesis of PHS/iBES/AS (70/20/10 (molar ratio) P-hydroxystyrene/P-(1-iso-butoxyethoxystyrene/P-acetoxystyrene copolymer)

360 g of a poly-p-hydroxystyrene (weight-average molecular weight: 11,000) and 126.0 g of isobutyl vinyl ether were dissolved in 1,800 m of dehydrated THF. To the solution thus obtained was added 0.1 g of p-toluenesulfonic acid. The mixture was then stirred at room temperature for 2 hours.

To the reaction solution was then added 40 g of pyridine. To the mixture was then added 42 g of acetic anhydride. The mixture was then stirred at room temperature for 2 hours.

The reaction solution was poured into 3 l of water. The resulting powder was collected by filtration, washed with water, and then dried to obtain a 70/20/10 p-hydroxystyrene/p-(i-butoxyethoxy)styrene/acetyloxystyrene copolymer (weight-average molecular weight: 12,000).

(d) Synthesis of Dissolution Inhibitive Compounds Dissolution Inhibitive Compound Synthesis Example 1: Synthesis of Compound Example 16

42.4 g (0.10 mol) of 1-[α-methyl-α-(4'-hydroxyphenyl) ethyl]-4-[α',α'-bis(4"-hydroxyphenyl)ethyl]benzene was dissolved in 300 ml of N,N-dimethylacetamide. To the solution were added 49.5 g (0.35 mol) of potassium carbonate and 84.8 g (0.33 mol) of cumyl ester bromoacetate. The mixture was then stirred at a temperature of 120° C. for 7 hours. The reaction mixture was then poured into 2 l of ion-exchanged water. The reaction mixture was neutralized with acetic acid, and then extracted with ethyl acetate. The resulting extract was concentrated, and then purified in the same manner as in Synthesis Example 3 to obtain 70 g of Compound Example 16 (in which all R's represent —$CH_2COOC(CH_3)_2C_6H_5$ group).

Dissolution Inhibitive Compound Synthesis Example 2: Synthesis of Compound Example 41

44 g of 1,3,3,5-tetrakis-(4-hydroxyphenyl)pentane was dissolved in 250 ml of N,N-dimethylacetamide. To the solution thus obtained were then added 70.7 g of potassium carbonate and 90.3 g of t-butyl bromoacetate. The mixture was then stirred at a temperature of 120° C. for 7 hours. The reaction mixture was then poured into 2 l of ion-exchanged water. The resulting viscous matter was washed with water, and then purified through column chromatography to obtain 87 g of Compound Example 41 (in which all R's represent —$CH_2COOC_4H_9(t)$).

Dissolution Inhibitive Compound Synthesis Example 3: Synthesis of Compound Example 43

20 g of α,α,α',α',α'',α''-hexakis(4-hydroxyphenyl)-1,3,5-triethylbenzene was dissolved in 400 ml of diethyl ether. To the solution thus obtained were then added 42.4 g of 3,4-dihydro-2H-pyran and hydrochloric acid in the catalytic amount in an atmosphere of nitrogen. The reaction mixture was then heated under reflux for 24 hours. After the termination of reaction, to the reaction solution was added a small amount of sodium hydroxide. The reaction mixture was then filtered. The filtrate was concentrated, and then purified through column chromatography to obtain 55.3 g of Compound Example 43 (in which all R's represent THP).

EXAMPLES 1 TO 8 AND COMPARATIVE EXAMPLES 1 TO 3

The compounds obtained by the foregoing synthesis examples were used to prepare resists. The formulation is set forth in Table 1 below.

TABLE 1

| | Photo-acid Generator | Resin (g) | | Additive (Dissolution Inhibitor, Alkali-Soluble Resin) | | Acid-decomposable Group | Amine | Sensitivity (mJ/cm$^2$) | Resolution (μm) | Change in Line Width (%) |
|---|---|---|---|---|---|---|---|---|---|---|
| Example 1 | (II-1) 0.1 g | PHS/THPS | 1.90 g | | | | (I-1) 0.02 g | 20 | 0.24 | 2.1 |
| Example 2 | (II-2) 0.1 g | PHS/iBESB | 1.90 g | | | | (I-1) 0.02 g | 21 | 0.26 | 2.1 |
| Example 3 | (II-3) 0.1 g | PHS/EES | 1.90 g | | | | (I-2) 0.02 g | 21 | 0.24 | 1.5 |
| Example 4 | (II-4) 0.1 g | | | Dissolution Inhibitor (43) PHS/St | 0.50 g 1.40 g | THP | (I-2) 0.02 g | 22 | 0.25 | 2.7 |
| Example 5 | (III-1) 0.1 g | PHS/iBES/AS | 1.90 g | | | | (I-3) 0.02 g | 20 | 0.24 | 3.0 |
| Example 6 | (III-2) 0.1 g | PHS/iBES/AS | 1.60 g | Dissolution Inhibitor (16) | 0.30 g | CE | (I-3) 0.02 g | 24 | 0.25 | 1.8 |
| Example 7 | (IV-1) 0.1 g | PHS/THPS | 1.60 g | Dissolution Inhibitor (41) | 0.30 g | TBE | (I-4) 0.02 g | 23 | 0.26 | 4.1 |
| Example 8 | (IV-2) 0.1 g | PHS/tBOCS | 1.90 g | | | | (I-4) 0.02 g | 23 | 0.25 | 2.0 |
| Comparative Example 1 | (II-1) 0.10 g | PHS/THPS | 1.90 g | | | | DMAP 0.02 g | 32 | 0.28 | 5.5 |
| Comparative Example 2 | (II-1) 0.10 g | PHS/THPS | 1.90 g | | | | DMAP 0.04 g | 50 | 0.27 | 2.4 |
| Comparative Example 3 | Compound (A) 0.10 g | PHS/iBES | 1.60 g | | | | (I-1) 0.02 g | 33 | 0.28 | 10.5 |

DMAP: 4-(N,N-dimethylamino)pyridine

The abbreviations used in Table 1 have the following meaning.

<Polymer> The figure in parenthesis indicate molar ratio.
PHS/iBES: p-Hydroxystyrene/p-(1-iso-butoxyethoxystyrene) copolymer (60/40); weight-average molecular weight: 12,000
PHS/iBESB: Partially crosslinked p-Hydroxystyrene/p-(1-iso-butoxyethoxy)styrene copolymer (70/30); weight-average molecular weight: 96,000
PHS/EES: p-Hydroxystyrene/p-(1-ethoxyethoxy)styrene copolymer (55/45); weight-average molecular weight: 13,000
PHS/THPS: p-Hydroxystyrene/p-(2-tetrahydropyranyloxy)styrene copolymer (60/40); weight-average molecular weight: 12,000
PHS/tBOCS: p-Hydroxystyrene/p-(t-butyloxycarbonyloxy)styrene copolymer (60/40); weight-average molecular weight: 12,000
PHS/St: p-Hydroxystyrene/styrene copolymer (85/15); weight-average molecular weight: 51,000
PHS/iBES/AS: p-Hydroxystyrene/p-(1-iso-butoxyethoxystyrene)/p-acetoxystyrene copolymer (70/20/10); weight-average molecular weight: 12,000

<Acid-Decomposable Droup in Dissolution Inhibitor>
TBE: —O—CH$_2$—COO—C$_4$H$_9$t
CE: —O—CH$_2$—COO—C(CH$_3$)$_2$C$_6$H$_5$ THP: 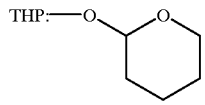

<Compound (A) For Comparative Example>
Triphenylsulfonium trifluoromethanesulfonate Preparation and Evaluation of Photosensitive Composition The materials set forth in Table 1 were each dissolved in 9.5 g of propylene glycol monomethyl ether acetate, and then filtered thorough a filter having a pore diameter of 0.1 μm to prepare a resist solution. The resist solution thus prepared was applied to a silicon wafer by means of a spin coater, and then dried at a temperature of 90° C. over a vacuum-absorption type hot plate for 60 seconds to obtain a resist layer having a thickness of 0.76 μm.

The resist layer was then exposed to light by means of a 248 nm KrF exima laser stepper (NA=0.42). Immediately after exposure, the resist layer was heated over a 110° C. vacuum-absorption type hot plate for 60 seconds. The resist layer was immediately dipped in a 2.38% aqueous solution of tetramethylammonium hydroxide (TMAH) for 60 seconds, rinsed with water for 30 seconds, and then dried. The resulting pattern on the silicon wafer was then evaluated forprofile, sensitivity and resolution. The measurements were subjected to comparison among the various photosensitive compositions. The results are set forth in Table 1 above.

Profile

The pattern on the silicon wafer was observed by a scanning electron microscope to evaluate profile of resist.

Sensitivity

The sensitivity is defined by the exposure at which a 0.30 μm mask pattern is reproduced.

Resolution

The resolution represents the threshold resolution at the exposure at which a 0.30 μm mask pattern is reproduced.

The resist layer was exposed to light in the same manner as above, allowed to stand for 2 hours, heated in the same manner as above, immediately dipped in a 2.38% aqueous solution of tetramethylammonium hydroxide (TMAH) for 60 seconds, rinsed with water for 30 seconds, and then dried. The 0.30 μm mask pattern thus obtained was then measured for line width. The change in line width from the value measured immediately after exposure was then calculated. The results are set forth in Table 1.

The results in Table 1 show that the positive-working photosensitive compositions of the present invention exhibit a high sensitivity and a high resolution. This demonstrates that the positive-working photosensitive compositions of the present invention are excellent photosensitive compositions which exhibit a higher sensitivity and less line width change than those of Comparative Examples 1 to 3.

All the positive-working photosensitive compositions of the present invention had a rectangular profile.

The chemically-sensitized positive-working photosensitive composition of the present invention can provide a positive-working photosensitive composition which exhibits a good profile, a high sensitivity, a high resolution and little change in properties with time after exposure.

While the invention has been described in detail and with reference to specific embodiments thereof, it will be apparent to one skilled in the art that various changes and modifications can be made therein without departing from the spirit and scope thereof.

What is claimed is:
1. A positive-working photosensitive composition comprising (a) a basic nitrogen-containing compound having a polycyclic structure represented by the following general formula (I), (b) at least one of compounds represented by the following general formulae (II) to (IV) which generates an acid when irradiated with actinic rays, and (c) a resin containing a group which undergoes decomposition to increase its solubility in an alkaline developer when acted on by an acid:

(I)

wherein Y and Z may be the same or different and each represent a straight-chain, branched or cyclic alkylene group which may contain a hetero atom or may be substituted;

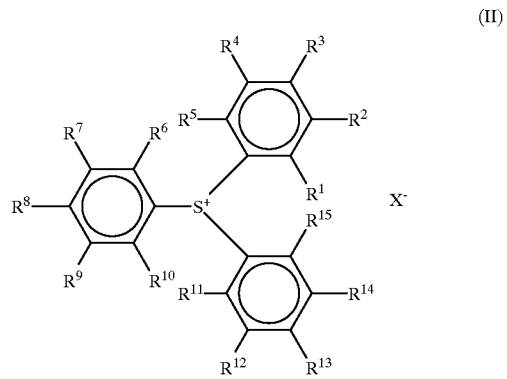

(II)

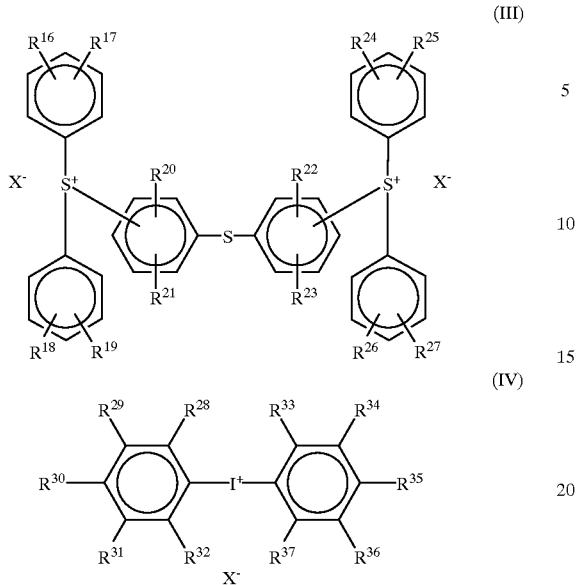

(III)

(IV)

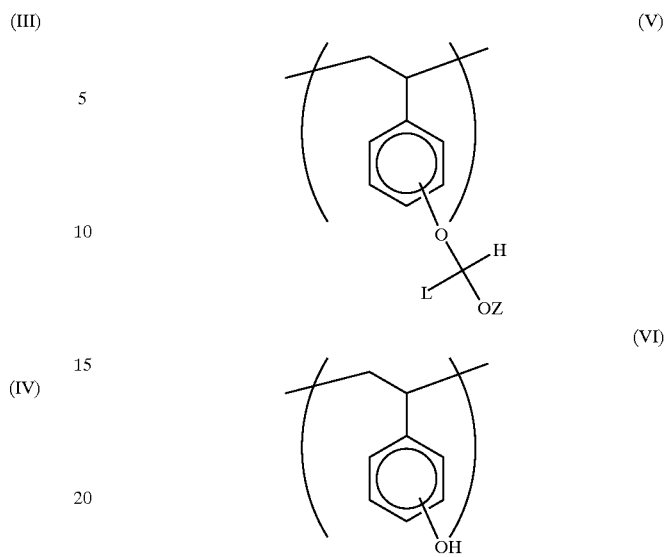

(V)

(VI)

wherein $R^1$ to $R^{37}$ each represent a hydrogen atom, straight-chain, branched or cyclic alkyl group, straight-chain, branched or cyclic alkoxy group, hydroxyl group, halogen atom or —S—$R^{38}$ in which $R^{38}$ represents a straight-chain, branched or cyclic alkyl or aryl group; and $X^-$ represents an anion of benzenesulfonic acid, naphthalenesulfonic acid or anthracenesulfonic acid having at least one group selected from the group consisting of branched or cyclic alkyl or alkoxy groups having 8 or more carbon atoms, at least two groups selected from the group consisting of straight-chain, branched or cyclic $C_{4-7}$ alkyl or alkoxy groups or at least three groups selected from the group consisting of straight-chain, branched or cyclic $C_{1-3}$ alkyl or alkoxy groups or an anion of benzenesulfonic acid, naphthalenesulfonic acid or anthracenesulfonic acid having at least one group selected from the group consisting of an ester group, $R^{39}$—CO— group, $R^{40}$—CONH—X0 group, $R^{41}$—NH— group, $R^{42}$—OCONH— group, $R^{43}$—NHCOO— group, $R^{44}$—NHCONH— group, $R^{45}$—NHCSN— group, $R^{46}$—SO$_2$NH— group and nitro group in which $R^{39}$ to $R^{46}$ each represent a straight-chain, branched or cyclic alkyl or aryl group.

2. The positive-working photosensitive composition according to claim 1, further comprising (d) a low molecular dissolution inhibitive compound with a molecular weight of not more than 3,000 containing a group capable of being decomposed by an acid, which increases its solubility in an alkaline developer when acted on by an acid.

3. The positive-working photosensitive composition according to claim 2, wherein said resin (c) which undergoes decomposition to increase its solubility in an alkaline developer when acted on by an acid is a resin containing a repeating structural unit represented by the following general formulae (V) and (VI):

wherein L represents a hydrogen atom, a straight-chain, branched or cyclic alkyl group or an aralkyl group, which may be substituted; Z represents a straight-chain, branched or cyclic alkyl group or an aralkyl group, which may be substituted; and Z and L may be connected to each other to form a 5- or 6-membered ring.

4. The positive-working photosensitive composition according to claim 1, wherein said resin (c) which undergoes decomposition to increase its solubility in an alkaline developer when acted on by an acid is a resin containing a repeating structural unit represented by the following general formulae (V) and (VI):

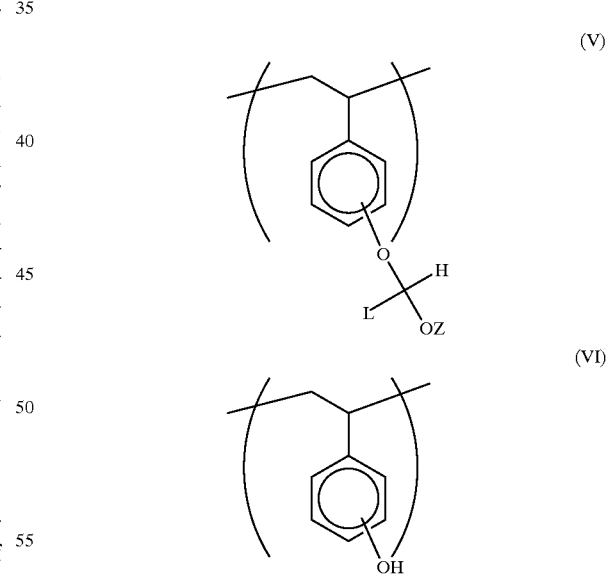

(V)

(VI)

wherein L represents a hydrogen atom, a straight-chain, branched or cyclic alkyl group or an aralkyl group, which may be substituted; Z represents a straight-chain, branched or cyclic alkyl group or an aralkyl group, which may be substituted; and Z and L may be connected to each other to form a 5- or 6-membered ring.

5. The positive-working photosensitive composition according to claim 1, wherein $X^-$ in general formulae (II) to (IV) represents an anion of benzenesulfonic acid having at least one group selected from the group consisting of branched or cyclic alkyl or alkoxy groups having 8 or more carbon atoms, at least two groups selected from the group consisting of straight-chain, branched or cyclic $C_{4-7}$ alkyl or alkoxy groups, at least three groups selected from the group consisting of straight-chain, branched or cyclic $C_{1-3}$ alkyl or alkoxy groups, or an ester group.

6. A positive-working photosensitive composition comprising (a) a basic nitrogen-containing compound having a polycyclic structure represented by general formula (I), (b) at least one of compounds represented by general formulae (II) to (IV) which generates an acid when irradiated with actinic rays, (d) a low molecular dissolution inhibitive compound with a molecular weight of not more than 3,000 containing a group capable of being decomposed by an acid which increases its solubility in an alkaline developer when acted on by an acid, and (e) a resin insoluble in water but soluble in an alkaline developer:

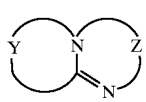

(I)

wherein Y and Z may be the same or different and each represent a straight-chain, branched or cyclic alkylene group which may contain a hetero atom or may be substituted;

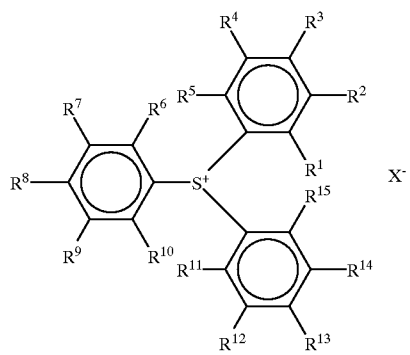

(II)

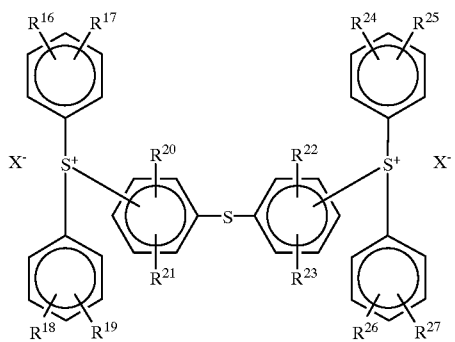

(III)

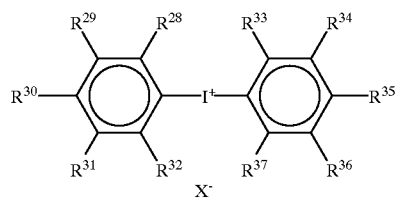

(IV)

wherein $R^1$ to $R^{37}$ each represent a hydrogen atom, straight-chain, branched or cyclic alkyl group, straight-chain, branched or cyclic alkoxy group, hydroxyl group, halogen atom or —S—$R^{38}$ in which $R^{38}$ represents a straight-chain, branched or cyclic alkyl or aryl group; and $X^-$ represents an anion of benzenesulfonic acid, naphthalenesulfonic acid or anthracenesulfonic acid having at least one group selected from the group consisting of branched or cyclic alkyl or alkoxy groups having 8 or more carbon atoms, at least two groups selected from the group consisting of straight-chain, branched or cyclic $C_{4-7}$ alkyl or alkoxy groups or at least three groups selected from the group consisting of straight-chain, branched or cyclic $C_{1-3}$ alkyl or alkoxy groups or an anion of benzenesulfonic acid, naphthalenesulfonic acid or anthracenesulfonic acid having at least one group selected from the group consisting of an ester group, $R^{39}$—CO— group, $R^{40}$—CONH— group, $R^{41}$—NH— group, $R^{42}$—OCONH— group, $R^{43}$—NHCOO— group, $R^{44}$—NHCONH— group, $R^{45}$—NHCSN— group, $R^{46}$—$SO_2NH$— group and nitro group in which $R^{39}$ to $R^{46}$ each represent a straight-chain, branched or cyclic alkyl or aryl group.

7. The positive-working photosensitive composition according to claim 6, wherein $X^-$ in general formulae (II) to (IV) represents an anion of benzenesulfonic acid having at least one group selected from the group consisting of branched or cyclic alkyl or alkoxy groups having 8 or more carbon atoms, at least two groups selected from the group consisting of straight-chain, branched or cyclic $C_{4-7}$ alkyl or alkoxy groups, at least three groups selected from the group consisting of straight-chain, branched or cyclic $C_{1-3}$ alkyl or alkoxy groups, or an ester group.

* * * * *